United States Patent [19]

Iwasaki et al.

[11] Patent Number: 5,980,088
[45] Date of Patent: Nov. 9, 1999

[54] LASER DRAWING APPARATUS WITH PRECISION SCALING-CORRECTION

[75] Inventors: Etsuo Iwasaki; Takashi Okuyama, both of Tokyo, Japan

[73] Assignee: Asahi Kogaku Kogyo Kabushiki Kaisha, Tokyo, Japan

[21] Appl. No.: 08/867,195

[22] Filed: Jun. 2, 1997

[30] Foreign Application Priority Data

Jun. 4, 1996 [JP] Japan ................................ 8-163697

[51] Int. Cl.$^6$ ............................ G06F 19/00; B43L 13/00
[52] U.S. Cl. .................. 364/474.08; 250/235; 347/234; 355/53; 358/296; 358/481; 364/468.28
[58] Field of Search ........................ 219/121.8, 121.61, 219/121.62; 250/235; 347/234, 235, 248, 249, 250, 253; 355/53, 77; 358/296, 481; 382/145; 364/468.28, 474.08

[56] References Cited

U.S. PATENT DOCUMENTS

| | | | |
|---|---|---|---|
| 4,541,712 | 9/1985 | Whitney ................................ | 355/53 |
| 4,677,292 | 6/1987 | Shimada ................................ | 250/235 |
| 5,018,212 | 5/1991 | Manns et al. ........................ | 382/145 |
| 5,477,330 | 12/1995 | Dorr ...................................... | 358/296 |
| 5,635,976 | 6/1997 | Thuren et al. ........................ | 347/253 |

*Primary Examiner*—William Grant
*Assistant Examiner*—Steven R. Garland
*Attorney, Agent, or Firm*—Greenblum & Bernstein, P.L.C.

[57] ABSTRACT

A laser drawing apparatus is used to draw a pattern on a surface of a workpiece by scanning the workpiece surface with at least one laser beam and by modulating the laser beam on the basis of raster-graphic data in accordance with a series of clock pulses. In the apparatus, a detector detects a dimensional variation of the workpiece in a scanning direction of the laser beam with respect to a corresponding standard dimension of an ideal workpiece. A calculator calculates a degree of variation the dimension of the workpiece and the corresponding standard dimension of the ideal workpiece. A regulator serves to cyclically shift a phase of the clock pulses by a unit of less than $2\pi$, whereby the pattern to be drawn on the workpiece is dimensionally varied, in accordance with the degree of the dimensional variation of the workpiece.

48 Claims, 15 Drawing Sheets

LASER DRAWING APPARATUS WITH PRECISION SCALING-CORRECTION

BACKGROUND OF THE INVENTION

1. Field of the Invention

The present invention relates to a laser drawing apparatus for drawing a pattern on a surface of a workpiece by scanning the workpiece surface with laser beams, then by modulating the laser beams on the basis of raster-graphic data in accordance with a series of clock pulses.

2. Description of the Related Art

Such a laser drawing apparatus is used for drawing a fine pattern on a surface of a suitable workpiece. As a representative use of the laser drawing apparatus, a fine circuit pattern may be laser drawn on the workpiece when producing a printed circuit board using photolithography. In this case, the workpiece may be either a photosensitive film for producing a photomask or a photoresist layer formed on a suitable substrate.

Recently, a circuit pattern drawing system has been developed for efficiently carrying out a drawing of circuit pattern by integrating the use of a laser drawing apparatus, a CAD (Computer Aided Design) station for designing a circuit pattern, a CAM (Computer Aided Manufacturing) station for editing the designed circuit, an EWC (engineering work station) for commanding and controlling the drawing operation of the individual laser drawing apparatus and, finally, a LAN (local area network) through which the CAD station, the CAM station, the EWS and the laser drawing apparatuses are all connected to each other.

A circuit pattern is, thereby, designed and treated as vector-graphic data by the CAD station. The vector-graphic data may be fed from the CAD station to the CAM station, through the LAN, for editing of the designed circuit pattern, if necessary. In either case, the vector-graphic data is fed from the CAD station or CAM station to the EWS, through the LAN, and is stored in a recording medium, such as a hard disk, provided in the EWS.

The EWS suitably feeds the vector-graphic data to one of the laser drawing apparatuses, and the vector-graphic data are converted into raster-graphic data by a vector-to-raster graphic converter provided in the laser drawing apparatus. The raster-graphic data is developed and stored in a pattern memory (or bit-map memory) and, subsequently, the raster-graphic data is successively read from the pattern memory. A circuit pattern is then drawn on a surface of a workpiece by scanning the workpiece surface with the laser beams and by modulating the laser beam on the basis of the read raster-graphic data in accordance with a series of clock pulses.

Workpieces are inevitably subjected to fine dimensional variations or fluctuations derived from production-factors and environmental conditions under which the workpieces are produced. Accordingly, before proper dimensions can be given to a circuit pattern which is to be drawn on each of the workpieces, a scaling-correction must be carried out during a drawing-operation of the laser drawing apparatus.

For example, when a workpiece is two-dimensionally expanded with respect to it's standard dimensions thereof, the scaling-correction must be carried out such that a circuit pattern to be drawn on the expanded workpiece is, also, two-dimensionally scaled-up in accordance with dimensional differences between the expanded dimensions and the standard dimensions. On the contrary, when a workpiece is contracted with respect to the standard dimensions, the scaling-correction must be carried out such that a circuit pattern to be drawn on the contracted workpiece is scaled-down in accordance with dimensional differences between the contracted dimensions and the standard dimensions.

Conventionally, the scaling-correction has been statistically carried out under the assumption that workpieces manufactured under the same production-requirements are subjected to equal degrees of dimensional variations or fluctuations. Nevertheless, in actuality, there may be relatively large dimensional variations or fluctuations among the workpieces manufactured under the same production-requirements. Accordingly, it cannot be said that the conventional statistical scaling-correction is necessarily reliable.

Further, conventionally, the scaling-correction is introduced into vector-graphic data in the CAM station. In this case, the scaling-correction is merely performed with a unit of a one-pixel size with respect to a circuit pattern to be drawn. Namely, in the conventional laser drawing apparatus, it is impossible to perform a precise scaling-correction with a unit of less than the one-pixel size.

SUMMARY OF THE INVENTION

Therefore, a main object of the present invention is to provide a laser drawing apparatus that constitutes a scaling-correction that can be precisely performed with a unit of less than a one-pixel size with respect to a circuit pattern to be drawn, in accordance with the dimensional variations or fluctuations of individual workpieces.

In accordance with a first aspect of the present invention, there is provided a laser drawing apparatus for drawing a pattern on a surface of a workpiece by scanning the workpiece surface with at least one laser beam and by modulating the laser beam on the basis of raster-graphic data, in accordance with a series of clock pulses, which apparatus comprises: a detector for detecting a dimensional variation of the workpiece in a scanning direction of the laser beam with respect to a standard dimension; a calculator for calculating a degree of variation between the dimension of the workpiece and the standard dimension; and a regulator for cyclically shifting a phase of the clock pulses by a unit of less than $2\pi$ in such a manner that the pattern to be drawn on the workpiece is dimensionally varied, in accordance with the degree of the dimensional variation of the workpiece.

In the laser drawing apparatus, the detector may comprise: an image sensor for optically and electronically sensing a mark of the workpiece with respect to a coordinate system, defined in a plane in which the workpiece surface is included, to thereby produce video signals carrying the mark thereof, the coordinate system defining the standard dimension; and a video-signal processor for processing the video signals so as to obtain the dimensional variation of the workpiece in the scanning direction with respect to the standard dimension defined in the coordinate system.

Also, in a laser drawing apparatus, the calculator may calculate the degree of variation between the dimension of the workpiece and the standard dimension as a degree of expansion/contraction of the workpiece in the scanning direction with respect to the standard dimension.

The laser drawing apparatus may further comprise a determiner for determining whether the degree of expansion/contraction of the workpiece is positive or negative. In this case, the regulator may regulate the cyclic shift of the phase of the clock pulses in either such a manner that the pattern to be drawn on the workpiece is dimensionally scaled-up when determining by the determiner that the degree of expansion/contraction of the workpiece is positive or such a manner that the pattern to be drawn on the workpiece is dimensionally scaled-down when determining by the determiner that the degree of expansion/contraction of the workpiece is negative.

In accordance with a second aspect of the present invention, there is provided a laser drawing apparatus for drawing a pattern on a surface of a workpiece by scanning the workpiece surface with at least one laser beam and by modulating the laser beam on the basis of raster-graphic data, in accordance with a series of clock pulses, the workpiece being scanned with the laser beam by deflecting the laser beam with respect to the workpiece, which apparatus comprises: a detector for detecting a dimensional variation of the workpiece in a scanning direction of the laser beam with respect to a standard dimension; a calculator for calculating a degree of variation between the dimension of the workpiece to the standard dimension; a determiner for determining whether the degree of the dimensional variation of the workpiece is positive or negative with respect to the standard dimension; a first regulator for cyclically shifting a phase of the clock pulses so as to be delayed by a unit of less than $2\pi$, upon determining by the determiner that the degree of the dimensional variation of the workpiece is positive, whereby the pattern to be drawn on the workpiece is dimensionally scaled-up in accordance with the positive degree of the dimensional variation of the workpiece; and a second regulator for cyclically shifting a phase of the clock pulses so as to be advanced by a unit of less than $2\pi$, upon determining by the determiner that the degree of the dimensional variation of the workpiece is negative, whereby the pattern to be drawn on the workpiece is dimensionally scaled-down in accordance with the negative degree of the dimensional variation of the workpiece.

In accordance with a third aspect of the present invention, there is provided a laser drawing apparatus for drawing a pattern on a surface of a workpiece by scanning the workpiece surface with at least one laser beam and by modulating the laser beam on the basis of raster-graphic data, in accordance with a series of clock pulses, the workpiece being scanned with the laser beam by moving the workpiece with respect to the laser beam, which apparatus comprises: a detector for detecting a dimensional variation of the workpiece in a scanning direction of the laser beam with respect to a standard dimension; a calculator for calculating a degree of variation between the dimension of the workpiece and the standard dimension; a determiner for determining whether the degree of the dimensional variation of the workpiece is positive or negative with respect to the standard dimension; a first regulator for cyclically shifting a phase of the clock pulses so as to be advanced with a unit of less than $2\pi$, upon determining by the determiner that the degree of the dimensional variation of the workpiece is positive, whereby the pattern to be drawn on the workpiece is dimensionally scaled-up, in accordance with the positive degree of the dimensional variation of the workpiece; and a second regulator for cyclically shifting a phase of the clock pulses so as to be delayed by a unit of less than $2\pi$, upon determining by the determiner that the degree of the dimensional variation of the workpiece is negative, whereby the pattern to be drawn on the workpiece is dimensionally scaled-down in accordance with the negative degree of the dimensional variation of the workpiece.

In accordance with a fourth aspect of the present invention, there is provided a laser drawing apparatus for drawing a pattern on a surface of a workpiece by scanning the workpiece surface with at least one laser beam and by modulating the laser beam on the basis of raster-graphic data, in accordance with a series of clock pulses, the workpiece being scanned with the laser beam by deflecting the laser beam with respect to the workpiece, which apparatus comprises: a detector for detecting a dimensional variation of the workpiece in a scanning direction of the laser beam with respect to a standard dimension; a calculator for calculating a degree of variation between the dimension of the workpiece and the standard dimension; a determiner for determining whether the degree of the dimensional variation of the workpiece is positive or negative with respect to the standard dimension; and a regulator for cyclically shifting a phase of the clock pulses by a unit of less than $2\pi$ in such a manner that the pattern to be drawn on the workpiece is dimensionally varied, in accordance with either the positive degree or the negative degree of the dimensional variation of the workpiece, determined by the determiner, wherein the regulator regulates the cyclic shift of the phase of the clock pulses either to cause a delay in the phase of the clock pulses in such a manner that the pattern to be drawn on the workpiece is dimensionally scaled-up when determining by the determiner that the degree of dimensional variation of the workpiece is positive or to cause an advance in the phase of clock pulses in such a manner that the pattern to be drawn on the workpiece is dimensionally scaled-down when determining by the determiner that the degree of dimensional variation the workpiece in negative.

In this apparatus, the regulator may comprise: a clock pulse generator for producing at least two series of clock pulses on the basis of a series of basic clock pulses, the respective series of clock pulses having phases which are shifted from each other; a switcher for selectively outputting any one of the plural series of clock pulses from the clock pulse generator; and a controller for controlling the switcher so as to output the plural series of clock pulses therefrom in either a first clock-pulse-outputting order to cause the cyclic delay in the phase of the outputted clock pulses or a second clock-pulse-outputting order to cause the cyclic advance in the phase of the outputted clock pulses, wherein, upon determining by the determiner that the degree of the dimensional variation of the workpiece is positive, the controller controls the switcher so as to output the plural series of clock pulses therefrom in the first clock-pulse-outputting order, and wherein, upon determining by the determiner that the degree of the dimensional variation of the workpiece is negative, the controller controls the switcher so as to output the plural series of clock pulses therefrom in the second clock-pulse-outputting order.

In accordance with a fifth aspect of the present invention, there is provided a laser drawing apparatus for drawing a pattern on a surface of a workpiece by scanning the workpiece surface with at least one laser beam and by modulating the laser beam on the basis of raster-graphic data, in accordance with a series of clock pulses, the workpiece being scanned with the laser beam by moving the workpiece with respect to the laser beam, which apparatus comprises: a detector for detecting a dimensional variation of the workpiece in a scanning direction of the laser beam with respect to a standard dimension; a calculator for calculating a degree of variation between the dimension of the workpiece and the standard dimension; a determiner for determining whether the degree of the dimensional variation of the workpiece is positive or negative with respect to the standard dimension; and a regulator for cyclically shifting a phase of the clock pulses by a unit of less than $2\pi$ in such a manner that the pattern to be drawn on the workpiece is dimensionally varied, in accordance with either the positive degree or the negative degree of the dimensional variation of the workpiece, determined by the determiner, wherein the regulator regulates the cyclic shift of the phase of the clock pulses either to cause an advance in the phase of the clock pulses in such a manner that the pattern to be drawn on the workpiece is dimensionally scaled-up when determining by the determiner that the degree of dimensional variation of the workpiece is positive or to cause a delay in the phase of clock pulses in such a manner that the pattern to be drawn on the workpiece is dimensionally scaled-down when determining by the determiner that the degree of dimensional variation the workpiece is negative.

In this apparatus, the regulator may comprise: a clock pulse generator for producing at least two series of clock pulses on the basis of a series of basic clock pulses, the respective series of clock pulses having phases which are shifted from each other; a switcher for selectively outputting any one of the plural series of clock pulses from the clock pulse generator; and a controller for controlling the switcher so as to output the plural series of clock pulses therefrom in either a first clock-pulse-outputting order to cause the cyclic advance in the phase of the outputted clock pulses or a second clock-pulse-outputting order to cause the cyclic delay in the phase of the outputted clock pulses, wherein, upon determining by the determiner that the degree of the dimensional variation of the workpiece is positive, the controller controls the switcher so as to output the plural series of clock pulses therefrom in the first clock-pulse-outputting order, and wherein, upon determining by the determiner that the degree of the dimensional variation of the workpiece is negative, the controller controls the switcher so as to output the plural series of clock pulses therefrom in the second clock-pulse-outputting order.

In accordance with a sixth aspect of the present invention, there is provided a laser drawing apparatus for drawing a pattern on a surface of a workpiece by scanning the workpiece surface with at least one laser beam in both a main-scanning direction and in a sub-scanning direction, the laser beam being modulated on the basis of raster-graphic data, the scanning of the workpiece with the laser beam in the main-scanning direction being carried out by deflecting the laser beam with respect to the workpiece, in accordance with a first series of clock pulses, the scanning of the workpiece with the laser beam in the sub-scanning direction being carried out by moving the workpiece with respect to the laser beam, in accordance with a second series of clock pulses, which comprises: a detector for detecting dimensional variations of the workpiece in both the main-scanning direction and the sub-scanning direction of the laser beam with respect to standard dimensions; a calculator for calculating respective degrees of variation between the dimensions of the workpiece, in both the main-scanning direction and the sub-scanning direction, and the standard dimensions; a first determiner for determining whether the degree of the dimensional variation of the workpiece, in the main-scanning direction, is positive or negative with respect to the corresponding standard dimension; a first regulator for cyclically shifting a phase of the first clock pulses by a unit of less than $2\pi$ in such a manner that the pattern to be drawn on the workpiece is dimensionally varied, in accordance with either the positive degree or the negative degree of the dimensional variation of the workpiece, determined by the first determiner, in the main-scanning direction; a second determiner for determining whether the degree of the dimensional variation of the workpiece, in the sub-scanning direction, is positive or negative with respect to the corresponding standard dimension; and a second regulator for cyclically shifting a phase of the second clock pulses by a unit of less than $2\pi$ in such a manner that the pattern to be drawn on the workpiece is dimensionally varied, in accordance with either the positive degree or the negative degree of the dimensional variation of the workpiece, determined by the second determiner, in the sub-scanning direction.

In this apparatus, the first regulator may comprise: a clock pulse generator for producing at least two series of clock pulses on the basis of a series of basic clock pulses, the respective series of clock pulses having phases which are shifted from each other; a switcher for selectively outputting any one of the plural series of clock pulses as the first series of clock pulses from the clock pulse generator; and a controller for controlling the switcher so as to output the plural series of clock pulses therefrom in either a first clock-pulse-outputting order to cause the cyclic delay in the phase of the outputted clock pulses or a second clock-pulse-outputting order to cause the cyclic advance in the phase of the outputted clock pulses, wherein, upon determining by the first determiner that the degree of the dimensional variation of the workpiece in the main-scanning direction is positive, the controller controls the switcher so as to output the plural series of clock pulses therefrom in the first clock-pulse-outputting order, and wherein, upon determining by the first determiner that the degree of the dimensional variation of the workpiece in the main-scanning direction is negative, the controller controls the switcher so as to output the series of clock pulses therefrom in the second clock-pulse-outputting order.

Also, the second regulator may comprise: a clock pulse generator for producing at least two series of clock pulses on the basis of a series of basic clock pulses, the respective series of clock pulses having phases which are shifted from each other; a switcher for selectively outputting any one of the plural series of clock pulses as the second series of clock pulses from the clock pulse generator; and a controller for controlling the switcher so as to output the plural series of clock pulses therefrom in either a first clock-pulse-outputting order to cause the cyclic advance in the phase of the outputted clock pulses or a second clock-pulse-outputting order to cause the cyclic delay in the phase of the outputted clock pulses, wherein, upon determining by the second determiner that the degree of the dimensional variation of the workpiece in the sub-scanning direction is positive, the controller controls the switcher so as to output the plural series of clock pulses therefrom in the first clock-pulse-outputting order, and wherein, upon determining by the second determiner that the degree of the dimensional variation of the workpiece in the sub-scanning direction is negative, the controller controls the switcher so as to output the plural series of clock pulses therefrom in the second clock-pulse-outputting order.

BRIEF DESCRIPTION OF THE DRAWINGS

The advantages and other objects of the present invention will be better understood from the following description, with reference to the accompanying drawings in which.

DESCRIPTION OF THE PREFERRED EMBODIMENTS

Figure 1:
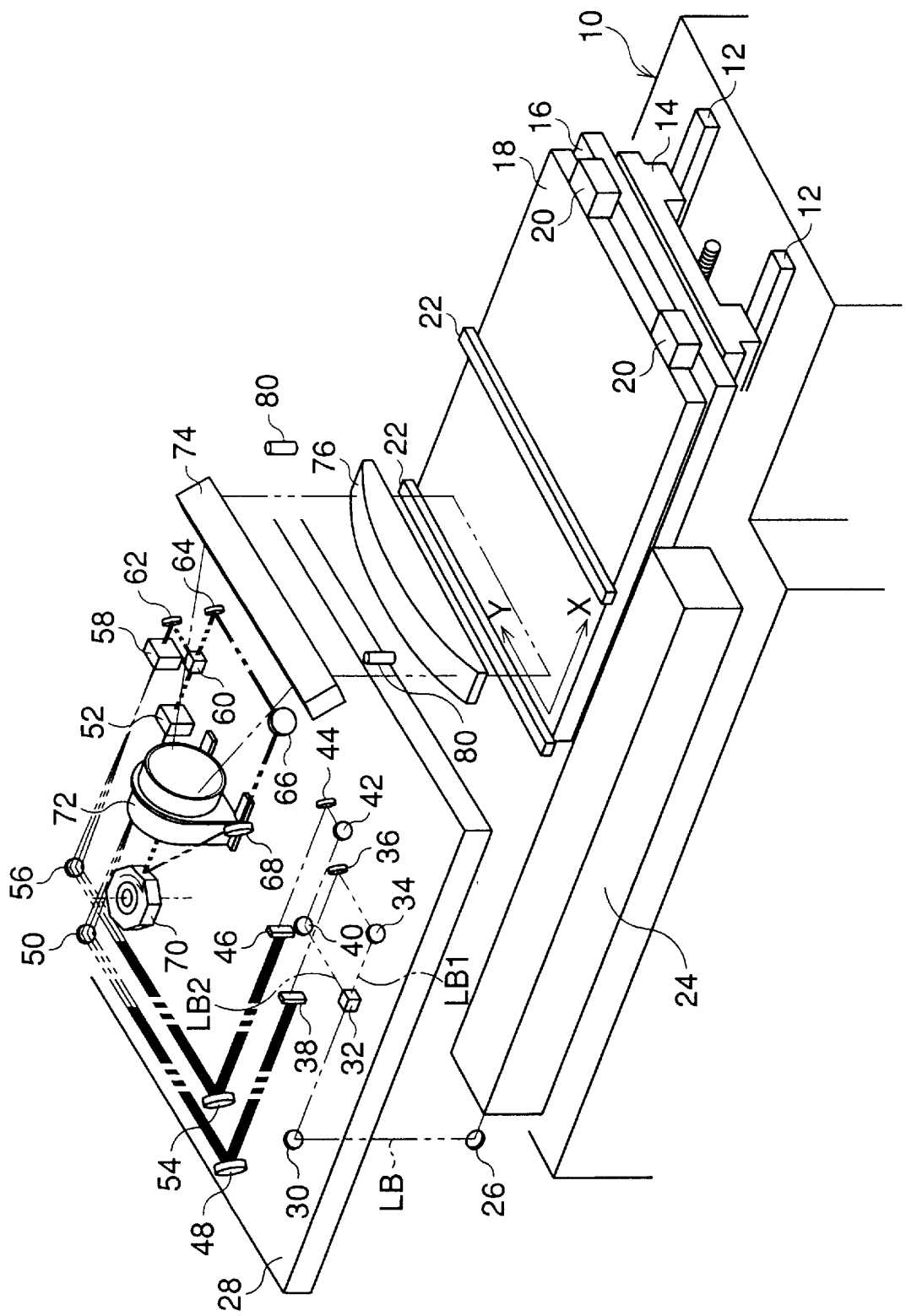
FIG. 1 is a schematic and perspective view showing a laser drawing apparatus according to the present invention.

FIG. 1 schematically and perspectively shows a laser drawing apparatus, which is constituted such that a circuit pattern is directly drawn on a photoresist layer formed on a substrate for producing a printed circuit board. The laser drawing apparatus comprises a base frame 10 installed on a floor and the base frame 10 is provided with a pair of guide rails 12 laid thereon.

The apparatus also comprises an X-table 14 movably provided on the pair of guide rails 12, a θ-table 16 rotatably provided on the X-table 14, and a drawing table 18 securely mounted on the θ-table 16. The X-table 14 is driven by a suitable motor, such as a stepping motor, a servo motor or the like so as to be moved along the guide rails 12. The θ-table 16 is rotatable around a pivot pin vertically protruded from a center of the X-table 14, and a rotational position of the θ-table 16, therefore, the drawing table 18 is minutely adjusted by minute drivers 20 provided on sides of the θ-table 16. Note, in FIG. 1, only two minute drivers 20 provided on one side of the θ-table 16 are illustrated, two minute drivers provided on the other side of the θ-table 16 are omitted from FIG. 1 to avoid the complication of illustration.

The substrate having the photoresist layer is fed to the drawing table 18 through a conveyer system such as a belt conveyer (not shown), and is clamped in place on the surface of the drawing table 18 by a clamper provided in the drawing table 18. Note, in FIG. 1, only a pair of clamping members of the clamper are designated by reference numeral 22.

Note, as shown in FIG. 1, an X-Y coordinate system is defined on a horizontal plane in which a surface of the drawing table 18 is included, with the X-Y coordinate system being immovable with respect to the base frame 10 of the apparatus. Further, note, for the sake of convenience, a positive direction of the Y-axis is defined as a main-scanning direction, and a negative direction of the X-axis is defined as a sub-scanning direction.

The apparatus further comprises an argon laser generator 24 provided on the base frame 10 and supported by suitable structural elements (not shown). A laser beam LB emitted from the argon laser generator 24 is reflected upward by a beam bender 26. Note, in this embodiment, the argon laser generator 24 is a water-cooled type, and has an output power of 1.8 W, with a wavelength of the emitted laser beam being 488 nm.

A beam bender 30 is arranged on the plate-like frame 28, and receives the laser beam LB reflected by the beam bender 26. The laser beam LB received by the beam bender 30 is directed to a beam splitter 32 by which the laser beam LB is divided into two laser beams LB1 and LB2. Beam benders 34 and 36 are arranged on the plate-like frame 28 so as to direct the laser beam LB1 to a beam separator 38. Beam benders 40, 42, and 44 are arranged so as to direct the laser beam LB2 to a beam separator 46.

The beam separator 38 further divides the laser beam LB1 into eight parallel laser beams, and the beam separator 46 further divides the laser beam LB2 into eight parallel laser beams. Beam benders 48 and 50 are arranged on the plate-like frame 28 such that the eight parallel laser beams divided by the beam separator 38 are directed to an electronic shutter 52, and beam benders 54 and 56 are arranged such that the eight parallel laser beams divided by the beam separator 46 are directed to an electric shutter 58.

Each of the electronic shutters 52 and 58 includes eight respective acoustic-optical modulators corresponding to the eight parallel laser beams concerned. The eight respective parallel laser beams passing through the electronic shutter 52 are directed to an optical composer 60 comprising a polarization beam splitter, and the eight respective parallel laser beams passing through the electronic shutter 58 are directed to the optical composer 60 through a beam bender 62. Both the groups of eight parallel laser beams are combined with each other by the optical composer 60, to thereby produce sixteen parallel laser beams.

Beam benders 66 and 68 are arranged on the plate-like frame 28 so as to direct the sixteen parallel laser beams, emitted from the optical composer 60, to a polygon mirror 70. In this embodiment, the polygon mirror 70 has a hexagonal mirror having six reflecting surfaces formed therearound. The sixteen parallel laser beams made incident on one of the reflecting surfaces of the polygon mirror 70 is directed to an fθ lens 72, and then the sixteen parallel laser beam passing through the fθ lens 72 is directed to a turning mirror 74, by which the laser beams are turned toward the surface of the drawing table 18. Thus, the turned laser beams are projected on the surface of the drawing table 19 through a condenser lens 76.

During a drawing-operation of the apparatus, the polygon mirror 70 is rotated such that the sixteen parallel laser beams are deflected along the main-scanning direction or positive direction of the Y-axis, whereby a workpiece is all at once scanned with the sixteen scanning-laser beams.

During the scanning operation, the sixteen respective laser beams are modulated in the sixteen acoustic-optical modulators of the electronic shutters 52 and 58 on the basis of the raster-graphic data in accordance with the series of clock pulses, whereby a part of the circuit pattern can be drawn on the workpiece.

Figure 2:
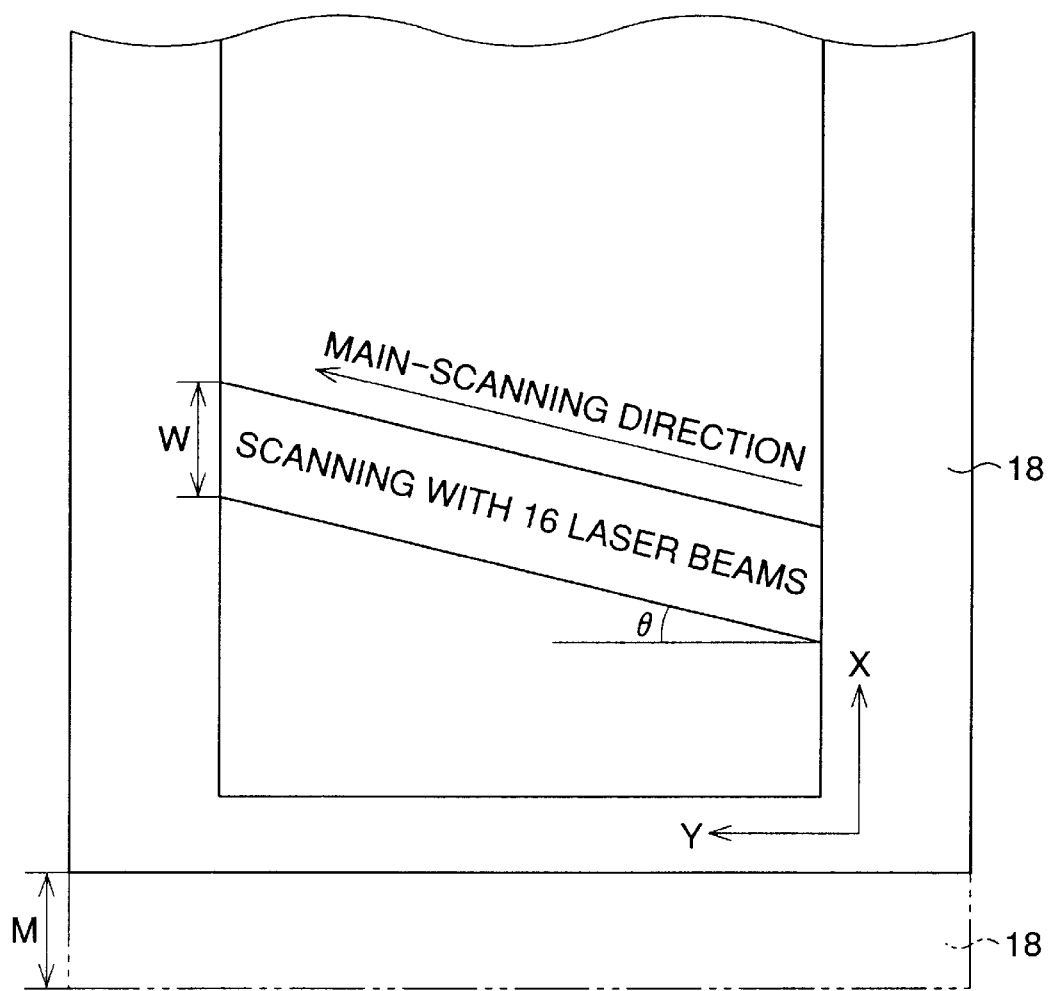
FIG. 2 is a conceptual view showing a manner of scanning a workpiece, using sixteen scanning-laser beams all at once in the laser drawing apparatus of FIG. 1.

Strictly speaking, as shown in FIG. 2, the main-scanning direction of the sixteen laser beams defines an angle of θ with the Y-axis because the drawing table 18 is moved in the sub-scanning direction or negative direction of the X-axis during the scanning of the workpiece with the sixteen laser beams. In particular, when the scanning of the workpiece with the sixteen laser beams is once completed, the drawing table 18 is moved by a distance M corresponding to a width W of the sixteen laser beams, resulting in the fact that the sixteen laser beams are deflected perpendicularly to the X-axis, along the main-scanning direction. Note, in FIG. 2, the workpiece placed on the drawing table 18 is indicated by reference WP.

Figure 3:
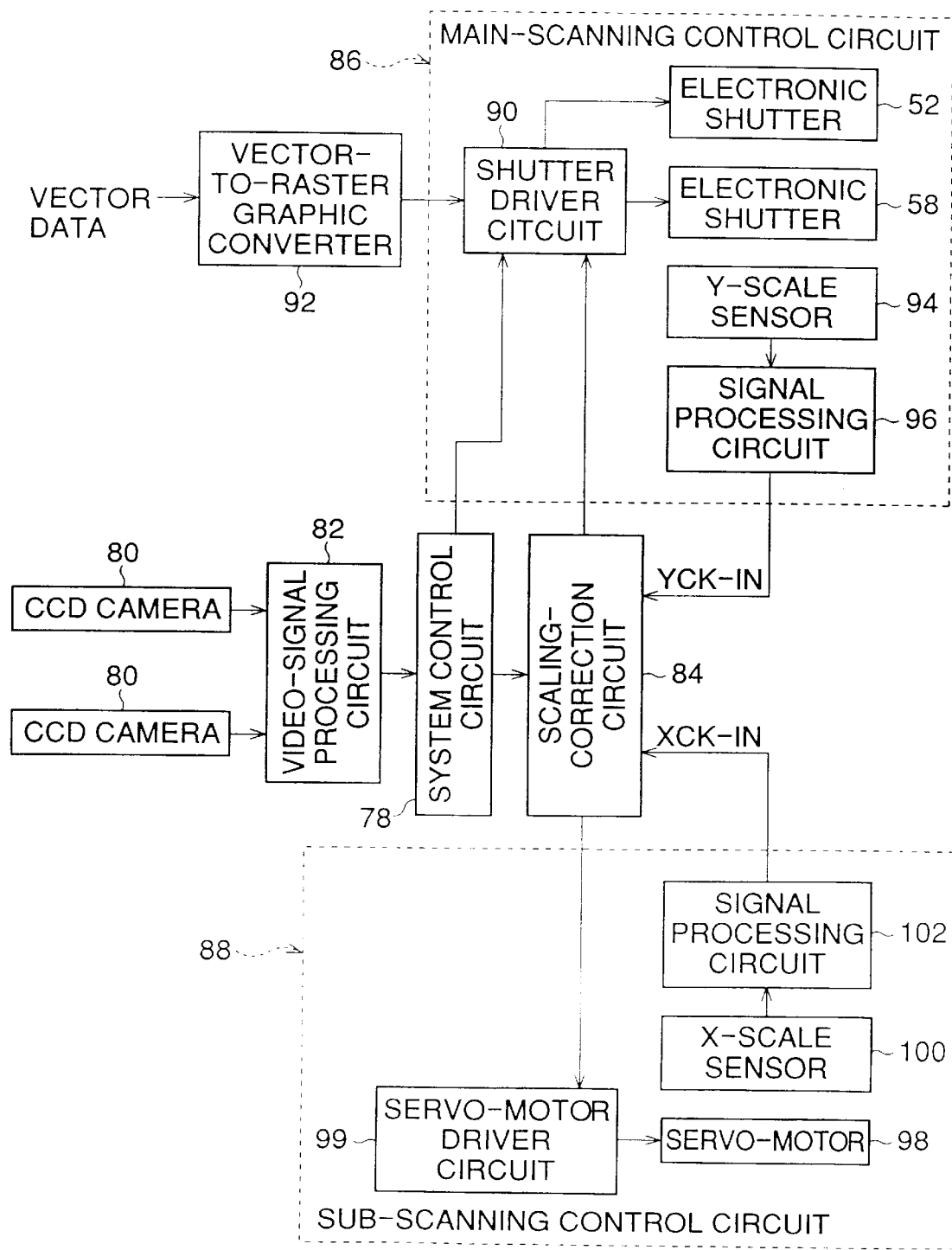
FIG. 3 is a block diagram of the laser drawing apparatus of FIG. 1.

FIG. 3 shows a block diagram of the laser drawing apparatus. In this drawing, reference numeral 78 indicates a system control circuit which may be constituted as a microcomputer comprising a central processing unit (CPU) or processor, a read-only memory (ROM) for storing programs, constants, etc, and a random access memory (RAM) for storing temporary data.

A pair of CCD (charge-coupled device) cameras 80 are connected to the system control circuit 78 through a video-signal processing circuit 82. As shown in FIG. 1, the CCD cameras 80 are displaced above the drawing table 18 beside the ends of the condenser lens 76, and are securely supported by a frame structure (not shown) of the apparatus so as to be immovable with respect to the X-Y coordinate system.

Usually, the CCD cameras 80 are used to detect a position of the workpiece placed on the drawing table 18, and this positional detection of the workpiece allows the laser drawing apparatus to draw a circuit pattern on the surface of the workpiece at a proper position thereof. Namely, whenever a circuit pattern is drawn on a surface of the individual workpieces with the sixteen scanning-laser beams, drawing-start positions in the main-scanning direction and the sub-scanning direction are regulated on the basis of the positional detection of the workpiece, whereby the circuit pattern can be drawn on the surface of the workpiece at the proper position thereof.

According to the present invention, not only are the CCD cameras 20 used for the detection of the position of the workpiece, but also the CCD cameras 80 are used for the determination of dimensional variations or fluctuations of the workpiece, as stated hereinafter in detail.

Figure 4:
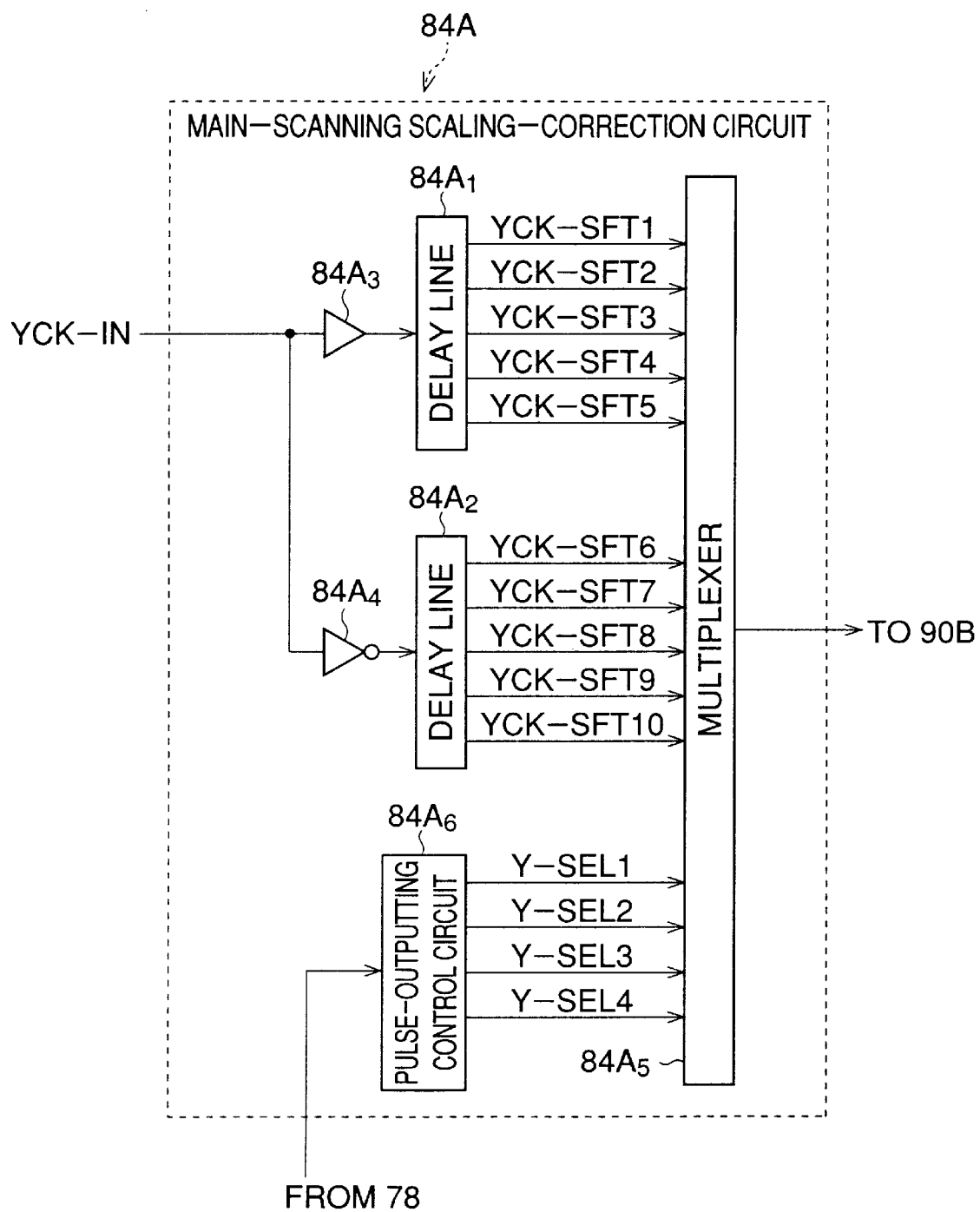
FIG. 4 is a block diagram showing a main-scanning scaling-correction circuit included in a scaling-correction circuit shown in FIG. 3.
Figure 5:
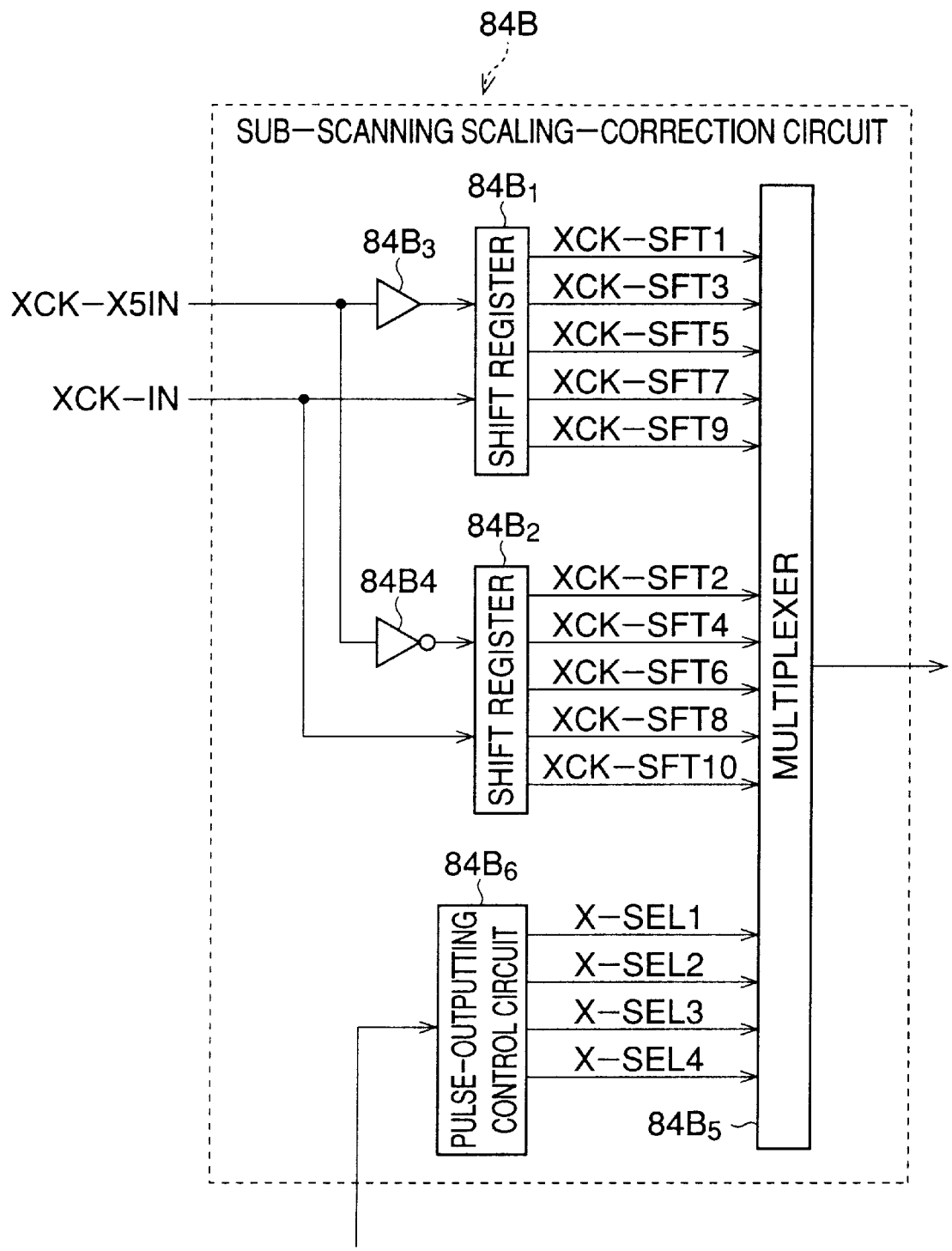
FIG. 5 is a block diagram showing a sub-scanning scaling-correction circuit included in a scaling-correction circuit shown in FIG. 3.

A scaling-correction control circuit 84 is connected to the system control circuit 78, and comprises a main-scanning scaling-correction circuit 84A, as shown in FIG. 4, and a sub-scanning scaling-correction circuit 84B, as shown in FIG. 5. The main-scanning scaling-correction circuit 84A governs a main-scanning control circuit 86, and the sub-scanning scaling-correction circuit 84B governs a sub-scanning control circuit 88, as shown in FIG. 3.

As is apparent from FIG. 4, the main-scanning scaling-correction circuit 84A includes a first delay line $84A_1$, a second delay line $84A_2$, a buffer $84A_3$, and an inverter $84A_4$. A series of basic clock pulses YCK-IN is inputted to the first delay lines $84A_1$ through the buffer $84A_3$, and is also inputted to the second delay line $84A_2$ through the inverter $84A_4$. Note, a phase of the basic clock pulses YCK-IN inverted by the inverter $84A_4$ and inputted to the second delay line $84A_2$ is shifted by π with respect to a phase of the basic clock pulses YCK-IN inputted to the first delay line $84A_1$.

In the first delay line $84A_1$, five series of clock pulses: first clock pulses YCK-SFT1; second clock pulses YCK-SFT2; third clock pulses YCK-SFT3; fourth clock pulses YCK-SFT4; and fifth clock pulses YCK-SFT5 are successively produced on the basis of the basic clock pulses YCK-IN, and outputted therefrom. Also, in the second delay line $84A_2$, five series of clock pulses: sixth clock pulses YCK-SFT6; seventh clock pulses YCK-SFT7; eighth clock pulses YCK-SFT8; ninth clock pulses YCK-SFT9; and tenth clock pulses YCK-SFT10 are successively produced on the basis of the inverted basic clock pulses YCK-IN.

Figure 6:
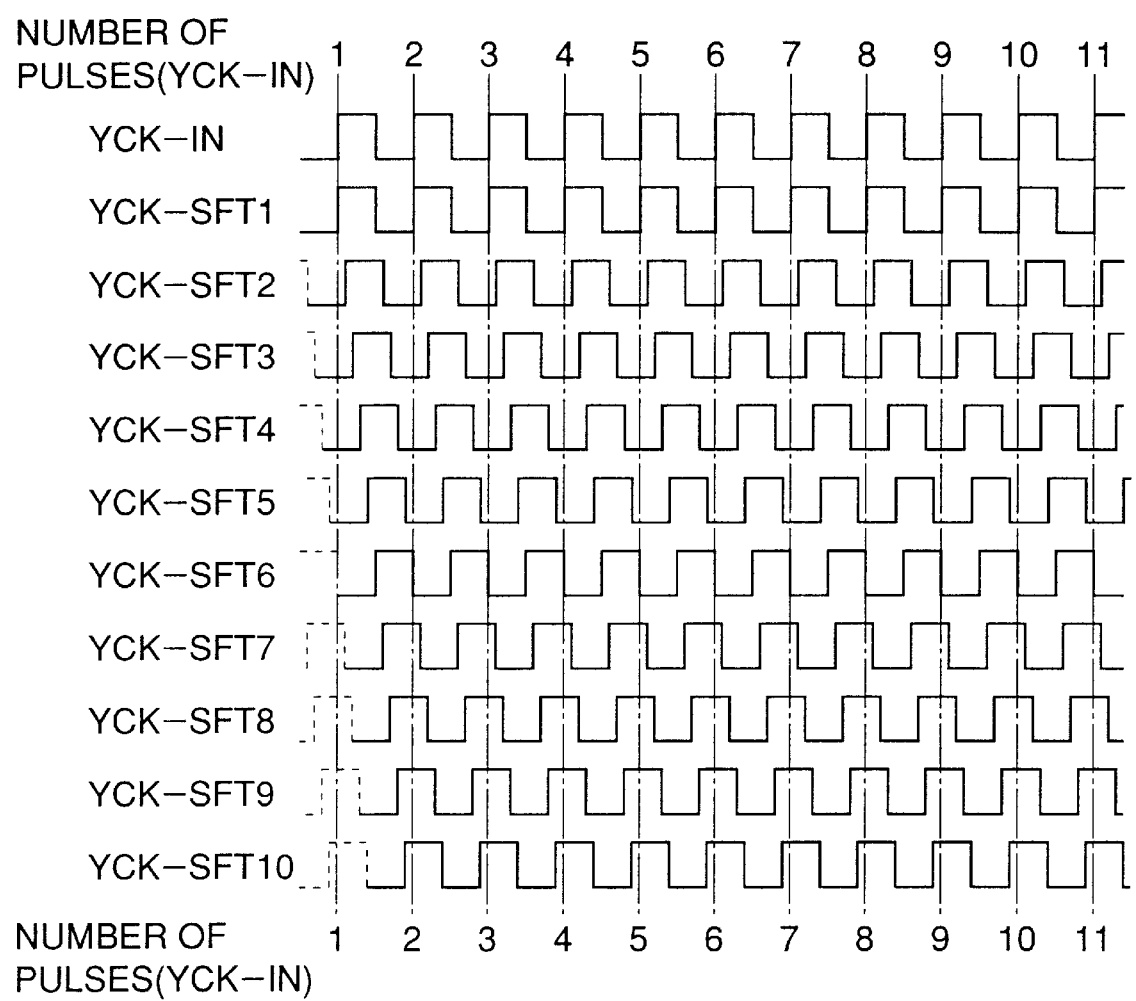
FIG. 6 is a timing-chart showing ten series of clock pulses produced in and outputted from the main-scanning scaling-correction circuit of FIG. 4.

As shown in a timing chart of FIG. 6, the first clock pulses YCK-SFT1 outputted from the first delay line $84A_1$ has the same phase as the basic clock pulses YCK-IN. The outputting of the second clock pulses YCK-SFT2 from the first delay line $84A_1$ is delayed in such a manner that a phase of the second clock pulses YCK-SFT2 is shifted by π/5 with respect to the first clock pulses YCK-SFT1. Similarly, the outputtings of the consecutive clock pulses YCK-SFT3; YCK-SFT4; and YCK-SFT5 from the first delay line $84A_1$ are successively delayed in the same manner as the second clock pulses YCK-SFT2. Thus, a phase of the fifth clock pulses YCK-SFT5 is shifted by 4π/5 with respect to the first clock pulses YCK-SFT1.

As shown in the timing chart of FIG. 6, a phase of the sixth clock pulses YCK-SFT6 outputted from the second delay line $84A_2$ is shifted by π with respect to the basic clock pulses YCK-IN. Namely, the sixth clock pulses YCK-SFT6 correspond to the basic clock pulses YCK-IN inverted by the inverter $84A_4$. The outputting of the seventh clock pulses YCK-SFT7 from the second delay line $84A_2$ is delayed in such a manner that a phase of the seventh clock pulses YCK-SFT7 is shifted by π/5 with respect to the sixth clock pulses YCK-SFT6. Similarly, the outputtings of the consecutive clock pulses YCK-SFT8; YCK-SFT9; and YCK-SFT10 from the second delay line $84A_2$ are successively delayed in the same manner as the seventh clock pulses YCK-SFT7. Thus, a phase of the tenth clock pulses YCK-SFT10 is shifted by 9π/5 with respect to the first clock pulses YCK-SFT1. Note, when a phase of the tenth clock pulses YCK-SFT10 is further shifted by π/5, the shifted phase is in coincidence with that of the first clock pulses YCK-SFT1.

As shown in FIG. 4, the main-scanning scaling-correction circuit 84A also includes a multiplexer $84A_5$ to which ten output lines extended from the first and second delay lines $84A_1$ and $84A_2$ are connected. Namely, the ten series of clock pulses: YCK-SFT1; YCK-SFT2; YCK-SFT3; YCK-SFT4; YCK-SFT5; YCK-SFT6; YCK-SFT7; YCK-SFT8; YCK-SFT9; and YCK-SFT10 are inputted to the multiplexer $84A_5$, and any one of the ten series of clock pulses is selectively outputted to the main-scanning control circuit 86. The main-scanning scaling correction circuit 84A further includes a pulse-outputting control circuit $84A_6$ by which it is determined which series of clock pulses should be outputted from the multiplexer $84A_5$.

In particular, the pulse-outputting control circuit $84A_6$ outputs four selection-signals: Y-SEL1; Y-SEL2; Y-SEL3; and Y-SEL4 to the multiplexer $84A_5$, and each of these selection-signals is changed either from a low level "L" to a high level "H" or from a high level "H" to a low level "L" under control of the system control circuit 78. By a combination of output-levels "L" and "H" of the selection-signals: Y-SEL1; Y-SEL2; Y-SEL3; and Y-SEL4, it is determined which series of clock pulses: YCK-SFT1; YCK-SFT2; YCK-SFT3; YCK-SFT4; YCK-SFT5; YCK-SFT6; YCK-SFT7; YCK-SFT8; YCK-SFT9; or YCK-SFT10 should be outputted from the multiplexer $84A_5$, as shown in TABLE 1 as follows:

TABLE 1

| SELECTION-SIGNALS | LEVEL | SELECTED CLOCK PULSES | SELECTION-SIGNALS | LEVEL | SELECTED CLOCK PULSE |
|---|---|---|---|---|---|
| Y-SEL1 | H | YCK-SFT1 | Y-SEL1 | L | YCK-SFT6 |
| Y-SEL2 | L |  | Y-SEL2 | H |  |
| Y-SEL3 | L |  | Y-SEL3 | H |  |
| Y-SEL4 | L |  | Y-SEL4 | L |  |
| Y-SEL1 | L | YCK-SFT2 | Y-SEL1 | H | YCK-SFT7 |
| Y-SEL2 | H |  | Y-SEL2 | H |  |
| Y-SEL3 | L |  | Y-SEL3 | H |  |
| Y-SEL4 | L |  | Y-SEL4 | L |  |
| Y-SEL1 | H | YCK-SFT3 | Y-SEL1 | L | YCK-SFT8 |
| Y-SEL2 | H |  | Y-SEL2 | L |  |
| Y-SEL3 | L |  | Y-SEL3 | L |  |
| Y-SEL4 | L |  | Y-SEL4 | H |  |
| Y-SEL1 | L | YCK-SFT4 | Y-SEL1 | H | YCK-SFT9 |
| Y-SEL2 | L |  | Y-SEL2 | L |  |
| Y-SEL3 | H |  | Y-SEL3 | L |  |
| Y-SEL4 | L |  | Y-SEL4 | H |  |
| Y-SEL1 | H | YCK-SFTS | Y-SEL1 | L | YCK-SFT10 |
| Y-SEL2 | L |  | Y-SEL2 | H |  |
| Y-SEL3 | H |  | Y-SEL3 | L |  |
| Y-SEL4 | L |  | Y-SEL4 | H |  |

As is apparent from TABLE 1, for example, when the output-level of the selection-signals Y-SEL1 and Y-SEL2 are the high level "H", and when the output-level of the selection-signals Y-SEL3 and Y-SEL4 are the low level "L", the third clock pulses YCK-SFT3 are outputted from the multiplexer $84A_5$. Also, when the output-level of the selection-signals Y-SEL1 and Y-SEL4 are the high level "H", and when the output-level of the selection-signals Y-SEL2 and Y-SEL3 are the low level "L", the ninth clock pulses YCK-SFT9 are outputted from the multiplexer $84A_5$.

As shown in FIG. 5, the sub-scanning scaling-correction circuit 84B includes a first shift register $84B_1$, a second shift register $84B_2$, a buffer $84B_3$, and an inverter $84B_4$. A series of basic clock pulses XCK-IN is inputted to the first and second shift registers $84B_1$ and $84B_2$. Further, a series of clock pulses XCK-5IN is inputted to the first shift register $84B_1$ through the buffer $84B_3$, and is also inputted to the second shift register $84B_2$, through the inverter $84B_4$.

Figure 7:
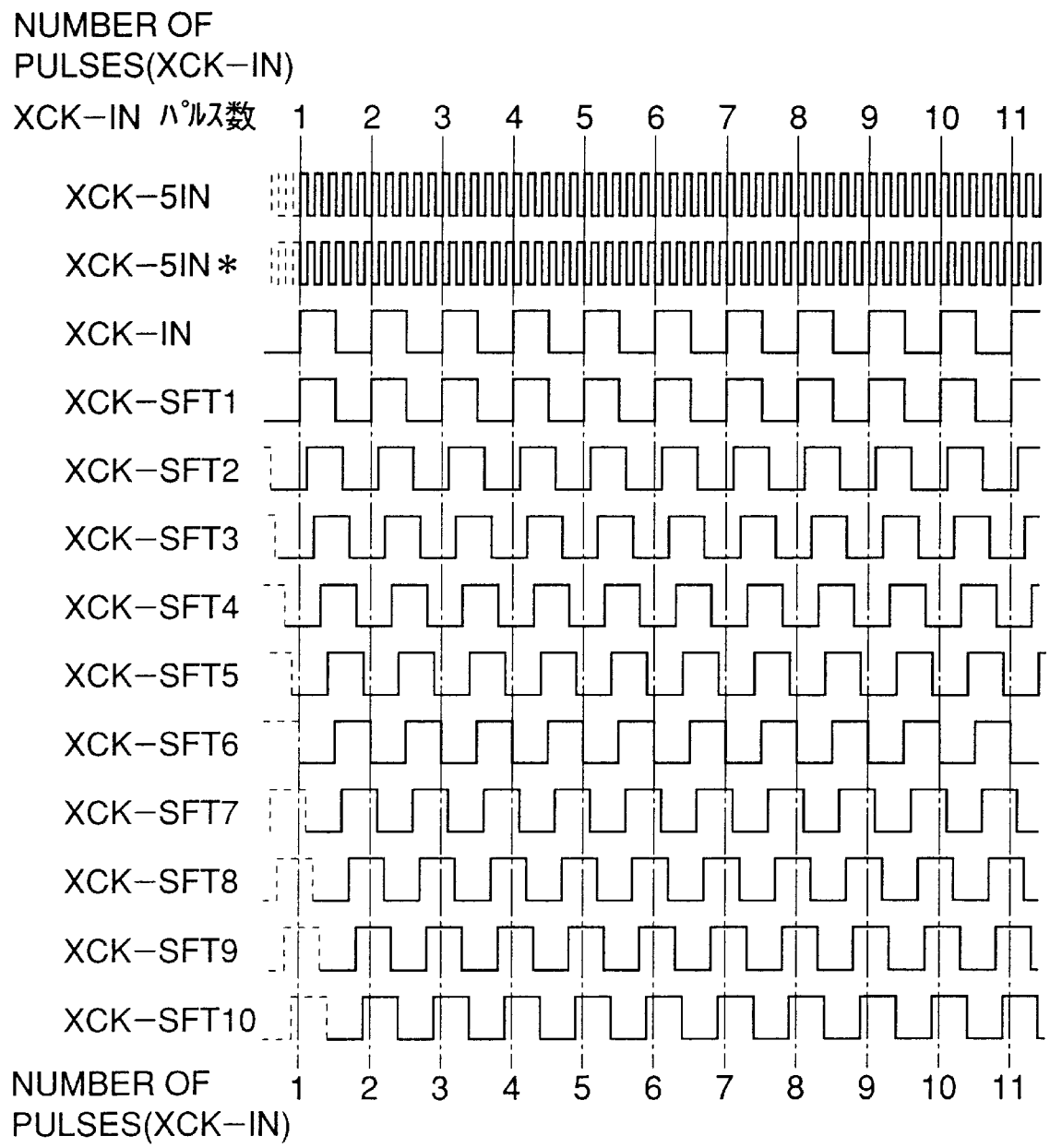
FIG. 7 is a timing-chart showing ten series of clock pulses produced in and outputted from the sub-scanning scaling-correction circuit of FIG. 5.

As shown in a timing chart of FIG. 7, the clock pulses XCK-5IN has a frequency which is five times the frequency of the basic clock pulses XCK-IN. In this timing chart, a series of clock pulses XCK-5IN* corresponds to the series of clock pulses XCK-5IN which has been inverted by the inverter $84B_4$, and then inputted to the second shift register $84B_2$.

In the first shift register $84B_1$, a first series of clock pulses XCK-SFT1 is produced on the basis of both the basic clock pulses XCK-IN and the clock pulses XCK-5IN, and is outputted therefrom. As is apparent from the timing chart of FIG. 7, the first clock pulses XCK-SFT1 outputted from the first shift register $84B_1$ has the same phase as the basic clock pulses XCK-IN. In the second shift register $84B_2$, a second series of clock pulses XCK-SFT2 is produced on the basis of both the basic clock pulses XCK-IN and the clock pulses XCK-5IN*, and is outputted therefrom. As shown in the timing chart of FIG. 7, the outputting of the second clock pulses XCK-SFT2 from the second shift register $84B_2$ is delayed in such a manner that a phase of the second clock pulses XCK-SFT2 is shifted by $\pi/5$ with respect to that of the first clock pulses XCK-SFT1.

In the first shift register $84B_1$, a third series of clock pulses XCK-SFT3 is produced on the basis of both the first clock pulses XCK-SFT1 and the clock pulses XCK-5IN, and is outputted therefrom. As shown in the timing chart of FIG. 7, the outputting of the third clock pulses XCK-SFT3 from the first shift register $84B_1$ is delayed in such a manner that a phase of the third clock pulses XCK-SFT3 is shifted by $\pi/5$ with respect to that of the second clock pulses XCK-SFT2. In the second shift register $84B_2$, a fourth series of clock pulses XCK-SFT4 is produced on the basis of both the second clock pulses XCK-SFT2 and the clock pulses XCK-5IN*, and is outputted therefrom. As shown in the timing chart of FIG. 7, the outputting of the fourth clock pulses XCK-SFT4 from the second shift register $84B_2$ is delayed in such a manner that a phase of the fourth clock pulses XCK-SFT4 is shifted by $\pi/5$ with respect to that of the third clock pulses XCK-SFT3.

In the first shift register $84B_1$, a fifth series of clock pulses XCK-SFT5 is produced on the basis of both the third clock pulses XCK-SFT3 and the clock pulses XCK-5IN, and is outputted therefrom. As shown in the timing chart of FIG. 7, the outputting of the fifth clock pulses XCK-SFT5 from the first shift register $84B_1$ is delayed in such a manner that a phase of the fifth clock pulses XCK-SFT3 is shifted by $\pi/5$ with respect to that of the fourth clock pulses XCK-SFT4. In the second shift register $84B_2$, a sixth series of clock pulses XCK-SFT6 is produced on the basis of both the fourth clock pulses XCK-SFT4 and the clock pulses XCK-5IN*, and is outputted therefrom. As shown in the timing chart of FIG. 7, the outputting of the sixth clock pulses XCK-SFT6 from the second shift register $84B_2$ is delayed in such a manner that a phase of the sixth clock pulses XCK-SFT6 is shifted by $\pi/5$ with respect to that of the fifth clock pulses XCK-SFT5.

In the first shift register $84B_1$, a seventh series of clock pulses XCK-SFT7 is produced on the basis of both the fifth clock pulses XCK-SFT5 and the clock pulses XCK-5IN, and is outputted therefrom. As shown in the timing chart of FIG. 7, the outputting of the seventh clock pulses XCK-SFT7 from the first shift register $84B_1$ is delayed in such a manner that a phase of the seventh clock pulses XCK-SFT7 is shifted by $\pi/5$ with respect to that of the sixth clock pulses XCK-SFT6. In the second shift register $84B_2$, an eighth series of clock pulses XCK-SFT8 is produced on the basis of both the sixth clock pulses XCK-SFT6 and the clock pulses XCK-5IN*, and is outputted therefrom. As shown in the timing chart of FIG. 7, the outputting of the eighth clock pulses XCK-SFT8 from the second shift register $84B_2$ is delayed in such a manner that a phase of the eighth clock pulses XCK-SFT8 is shifted by $\pi/5$ with respect to that of the seventh clock pulses XCK-SFT7.

In the first shift register $84B_1$, a ninth series of clock pulses XCK-SFT9 is produced on the basis of both the seventh clock pulses XCK-SFT7 and the clock pulses XCK-5IN, and is outputted therefrom. As shown in the timing chart of FIG. 7, the outputting of the ninth clock pulses XCK-SFT9 from the first shift register $84B_1$ is delayed in such a manner that a phase of the ninth clock pulses XCK-SFT9 is shifted by $\pi/5$ with respect to that of the eighth clock pulses XCK-SFT8. In the second shift register $84B_2$, a tenth series of clock pulses XCK-SFT10 is produced on the basis of both the eighth clock pulses XCK-SFT8 and the clock pulses XCK-5IN*, and is outputted therefrom. As shown in the timing chart of FIG. 7, the outputting of the tenth clock pulses XCK-SFT10 from the second shift register $84B_2$ is delayed in such a manner that a phase of the tenth clock pulses XCK-SFT10 is shifted by π/5 with respect to that of the ninth clock pulses XCK-SFT10.

As is apparent from the timing chart of FIG. 7, a phase of the tenth clock pulses XCK-SFT10 is shifted by 9π/5 with respect to the first clock pulses XCK-SFT1. Accordingly, when a phase of the tenth clock pulses XCK-SFT10 is further shifted by π/5, the shifted phase is in coincidence with that of the first clock pulses XCK-SFT1.

As shown in FIG. 5, the sub-scanning scaling-correction circuit 84B also includes a multiplexer 84B$_5$ to which ten output lines extended from the first and second shift registers 84B$_1$ and 84B$_2$ are connected. Namely, the ten series of clock pulses: XCK-SFT1; XCK-SFT2; XCK-SFT3; XCK-SFT4; XCK-SFT5; XCK-SFT6; XCK-SFT7; XCK-SFT8; XCK-SFT9; and XCK-SFT10 are inputted to the multiplexer 84B$_5$, and any one of the ten series of clock pulses is selectively outputted to the sub-scanning control circuit 88. The sub-scanning scaling-correction circuit 84B further includes a pulse-outputting control circuit 84B$_6$ by which it is determined which series of clock pulses should be outputted from the multiplexer 84B$_5$.

In particular, the pulse-outputting control circuit 84B$_6$ outputs four selection-signals: X-SEL1; X-SEL2; X-SEL3; and X-SEL4 to the multiplexer 84B$_6$, and each of these selection-signals is changed either from a low level "L" to a high level "H" or from a high level "H" to a low level "L" under control of the system control circuit 78. By a combination of output-levels "L" and "H" of the selection-signals: X-SEL1; X-SEL2; X-SEL3; and X-SEL4, it is determined which series of clock pulses: XCK-SFT1; XCK-SFT2; XCK-SFT3; XCK-SFT4; XCK-SFT5; XCK-SFT6; XCK-SFT7; XCK-SFT8; XCK-SFT9; or XCK-SFT10 should be outputted from the multiplexer 84B$_5$, as shown in TABLE 2 as follows:

TABLE 2

| SELEC-TION-SIGNALS | LEVEL | SELECTED CLOCK PULSES | SELEC-TION-SIGNALS | LEVEL | SELECTED CLOCK PULSE |
|---|---|---|---|---|---|
| X-SEL1 | H | XCK-SFT1 | X-SEL1 | L | XCK-SFT6 |
| X-SEL2 | L |  | X-SEL2 | H |  |
| X-SEL3 | L |  | X-SEL3 | H |  |
| X-SEL4 | L |  | X-SEL4 | L |  |
| X-SEL1 | L | XCK-SFT2 | X-SEL1 | H | XCK-SFT7 |
| X-SEL2 | H |  | X-SEL2 | H |  |
| X-SEL3 | L |  | X-SEL3 | H |  |
| X-SEL4 | L |  | X-SEL4 | L |  |
| X-SEL1 | H | XCK-SFT3 | X-SEL1 | L | XCK-SFT8 |
| X-SEL2 | H |  | X-SEL2 | L |  |
| X-SEL3 | L |  | X-SEL3 | L |  |
| X-SEL4 | L |  | X-SEL4 | H |  |
| X-SEL1 | L | XCK-SFT4 | X-SEL1 | H | XCK-SFT9 |
| X-SEL2 | L |  | X-SEL2 | L |  |
| X-SEL3 | H |  | X-SEL3 | L |  |
| X-SEL4 | L |  | X-SEL4 | H |  |
| X-SEL1 | H | XCK-SFTS | X-SEL1 | L | XCK-SFT10 |
| X-SEL2 | L |  | X-SEL2 | H |  |
| X-SEL3 | H |  | X-SEL3 | L |  |
| X-SEL4 | L |  | X-SEL4 | H |  |

As is apparent from TABLE 2, for example, when the output-level of the selection-signals X-SEL1 and X-SEL3 are the high level "H", and when the output-level of the selection-signals X-SEL2 and X-SEL4 are the low level "L", the third clock pulses XCK-SFT5 are outputted from the multiplexer 84B$_5$. Also, when the output-level of the selection-signals X-SEL2 and X-SEL3 are the high level "H", and when the output-level of the selection-signals X-SEL1 and X-SEL4 are the low level "L", the ninth clock pulses XCK-SFT6 are outputted from the multiplexer 84B$_5$.

Figure 8:
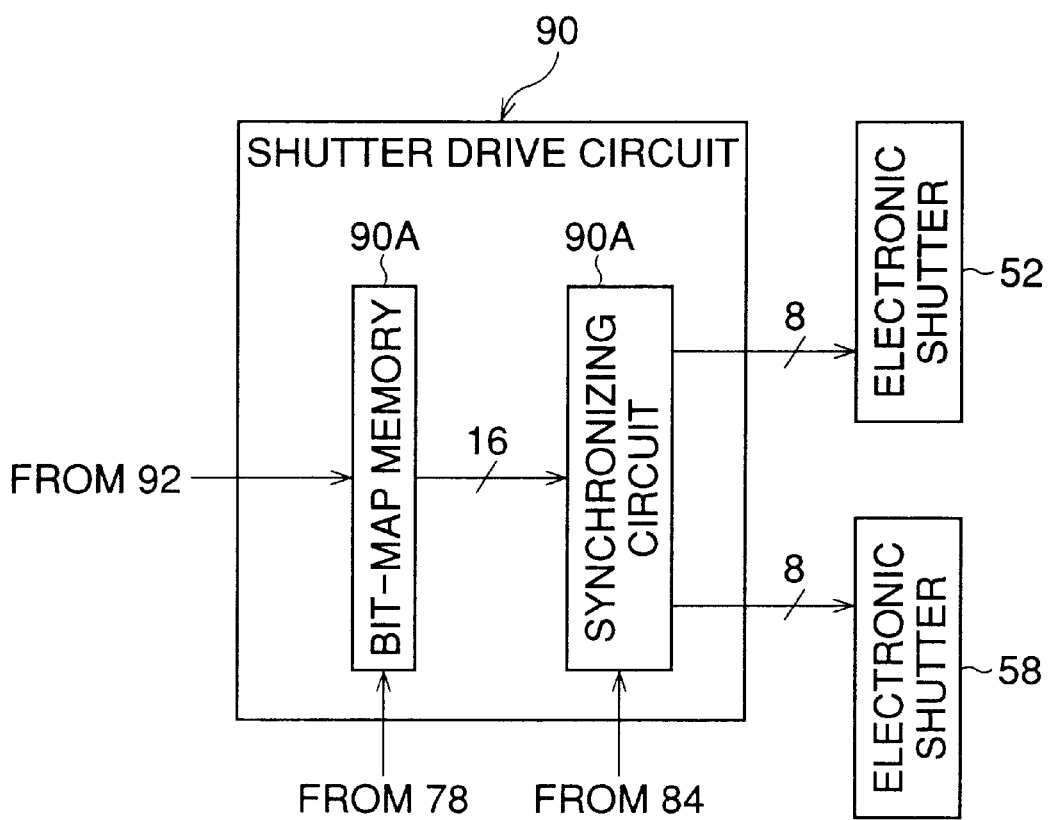
FIG. 8 is a block diagram of an electronic-shutter drive circuit shown in FIG. 3.

Referring again to FIG. 3, the main-scanning control circuit 86 is provided with a shutter driver circuit 90 for driving the electronic shutter 52 and 58. As shown in FIG. 8, the shutter driver circuit 90 includes a pattern memory (or bit-map memory 90A) connected to a vector-to-raster graphic converter 92 (FIG. 3), and a synchronizing circuit 90B connected to the bit-map memory 90B at an input side thereof and connected to the electronic shutters 52 and 58 at an output side thereof.

Although not illustrated in FIG. 3, the vector-to-raster graphic converter 92 is connected to an engineering work station (EWS) through a local area network (LAN), and the EWS feeds vector-graphic data to the vector-to-raster graphic converter 92. The vector-graphic data is converted into raster-graphic data by the vector-to-raster graphic converter 92 under the control of the system control circuit 78, and the converted raster-graphic data is developed and stored in the bit-map memory 90A.

The bit-map memory 90A has a capacity of temporarily storing more than 16 main-scan-lines of raster-graphic pixel data, and 16-bit raster-graphic pixel data included in sixteen consecutive main-scan-lines are successively read from the bit-map memory 90A in accordance with a series of clock pulses outputted from the system control circuit 78 to the bit-map memory 90A. The 16-bit raster-graphic pixel data read from the bit-map memory 90A is inputted to the synchronizing circuit 90B.

On the other hand, the synchronizing circuit 90B is arranged so as to output sixteen respective driving-signals to the sixteen acoustic-optical modulators of the electronic shutters 52 and 58 on the basis of the 16-bit raster-graphic pixel data in accordance with any one of the ten series of clock pulses: YCK-SFT1; YCK-SFT2; YCK-SFT3; YCK-SFT4; YCK-SFT5; YCK-SFT6; YCK-SFT7; YCK-SFT8; YCK-SFT9; and YCK-SFT10 outputted from the main-scanning scaling-correction circuit 84A to the synchronizing circuit 90B. Also, the output-timing of the sixteen driving-signals to the electronic shutters 52 and 58 can be regulated by successively and cyclically switching over the outputting of the ten series of clock pulses: YCK-SFT1; YCK-SFT2; YCK-SFT3; YCK-SFT4; YCK-SFT5; YCK-SFT6; YCK-SFT7; YCK-SFT8; YCK-SFT9; and YCK-SFT10.

The main-scanning control circuit 86 is further provided with a Y-scale sensor 94, and a signal processing circuit 96 connected thereto. The Y-scale sensor 94 forms a part of a Y-scale detection system incorporated in the laser drawing apparatus, as shown in FIG. 1, and the Y-scale detection system per se is well known in this field. In short, the Y-scale sensor 94 is used to detect a distance along which the sixteen scanning-laser beams are deflected during the scanning of the workpiece with the sixteen scanning-laser beams. A series of signals detected by the Y-scale sensor 94 are inputted to the signal processing circuit 96, in which the detected signals are processed, to thereby produce a series of clock pulses. The thus-produced clock signals are outputted as the basic clock pulses YCK-IN from the signal processing circuit 96 to the main-scanning scaling-correction circuit 84A (FIGS. 3 and 4).

The sub-scanning control circuit 88 is provided with a servo-motor 98 for driving the X-table 14 along the X-axis of the X-Y coordinate system, and a servo-motor driver circuit 99 connected to the servo-motor 98 for outputting a series of driving clock pulses thereto. During the scanning operation, the X-table 14 (i.e., the workpiece placed on the drawing table 18) is moved by a distance corresponding to a size of one pixel of a circuit pattern to be drawn, per every one clock pulse of the driving clock pulses. The outputting of the driving clock pulses from the servo-motor driver circuit 99 to the servo-motor 98 is carried out in accordance with any one of the ten series of clock pulses: XCK-SFT1; XCK-SFT2; XCK-SFT3; XCK-SFT4; XCK-SFT5; XCK-SFT6; XCK-SFT7; XCK-SFT8; XCK-SFT9; and XCK-SFT10 outputted from the sub-scanning scaling-correction circuit 84B to the servo-motor driver circuit 99. Also, the output-timing of the driving clock pulses to the servo-motor 98 can be regulated by successively and cyclically switching over the outputting of the ten series of clock pulses: XCK-SFT1; XCK-SFT2; XCK-SFT3; XCK-SFT4; XCK-SFT5; XCK-SFT6; XCK-SFT7; XCK-SFT8; XCK-SFT9; and XCK-SFT10.

The sub-scanning control circuit 88 is further provided with an X-scale sensor 100, and a signal processing circuit 102 connected thereto. The X-scale sensor 100 forms a part of an X-scale detection system incorporated in the laser drawing apparatus shown in FIG. 1, and the X-scale detection system per se is well known in this field. In short, the X-scale sensor 100 is used to detect a distance along which the drawing table 18 is moved during the scanning of the workpiece with the sixteen scanning-laser beams. A series of signals detected by the X-scale sensor 100 are inputted to the signal processing circuit 102, in which the detected signals are processed to thereby produce a series of clock pulses. The thus-produced clock signals are outputted as the basic clock pulses XCK-IN from the signal processing circuit 102 to the sub-scanning scaling-correction circuit 84B (FIGS. 3 and 5). Note, the series of clock pulses XCK-5IN are outputted from the system control circuit 78 to the sub-scanning control circuit 84B.

A principle of the scaling-correction according to the present invention will now be explained below.

Figure 9:
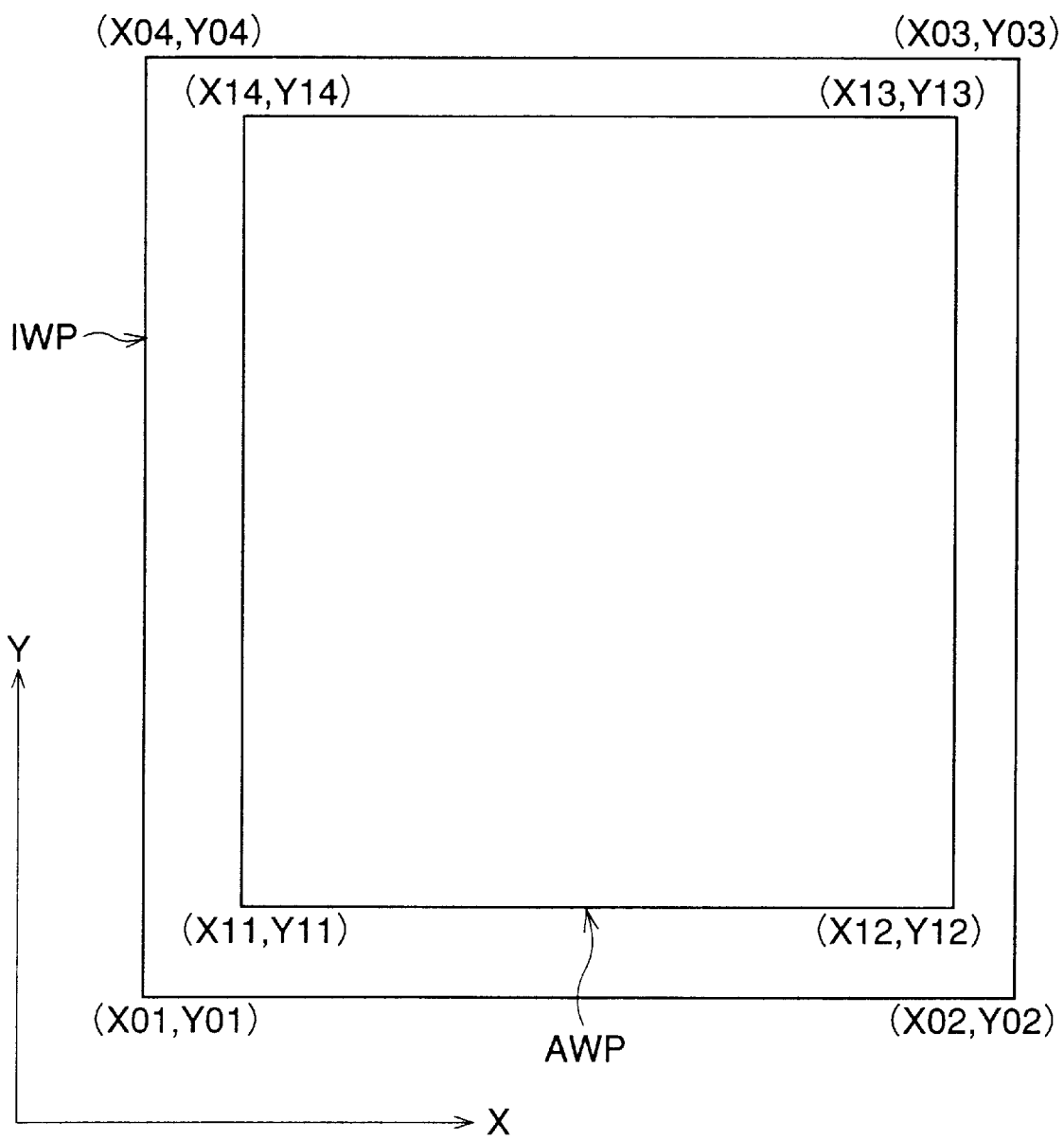
FIG. 9 is a conceptual view showing a positional and dimensional relationship between an ideal workpiece and an actual workpiece on a X-Y coordinate system defined on a horizontal plane including a surface of a drawing table of the laser drawing apparatus.

FIG. 9 conceptually shows a positional and dimensional relationship between an ideal workpiece IWP and an actual workpiece AWP on the X-Y coordinate system defined on the horizontal plane in which the surface of the drawing table 18 is included. The ideal workpiece IWP has a standard dimensions, whereas the actual workpiece AWP is subjected to dimensional variations or fluctuations with respect to the standard dimensions of the ideal workpiece IWP. Note, in the example shown in FIG. 9, the actual workpiece AWP is two-dimensionally contracted with respect to the ideal workpiece IWP, and the dimensional relationship therebetween is exaggeratedly illustrated.

The ideal workpiece IWP is conceptually defined in the X-Y coordinate system on the surface of the drawing table 18, and has four positioning-marks defining the four corners thereof. In FIG. 9, the four respective positioning-marks of the ideal workpiece IWP are represented by four sets of coordinates: (X01, Y01); (X02, Y02); (X03, Y03); and (X04, Y04). These sets of coordinates of the ideal workpiece IWP may be logically obtained at a design stage of the laser beam apparatus, and are previously stored as ideal coordinate-data in the ROM of the system control circuit 78. Optionally, the ideal coordinate-data may be stored in a memory of the engineering work station (EWS). In this case, before a drawing operation is carried out, the ideal coordinate-data is fed from the EWS to the laser drawing apparatus, and is temporarily stored in the RAM of the system control circuit 78.

The actual workpiece AWP also has four positioning-marks defining the four corners thereof, and the four respective positioning-marks are utilized in order to detect a position of the actual workpiece AWP, by the CCD cameras 80, upon placing the actual workpiece AWP on the drawing table 18. In FIG. 9, the four positioning-marks of the actual workpiece AWP are represented by four sets of coordinates: (X11, Y11); (X12, Y12); (X13, Y13); and (X14, Y14). These coordinates are obtained with respect to the CCD cameras 80.

In particular, after the actual workpiece AWP is placed on the drawing table 18, firstly, two of the four positioning-marks are photographed by the CCD cameras 80, respectively. Then, the drawing table 18 is moved until the remaining two positioning-marks are observed by the CCD cameras 80, and these positioning-marks are then, also, photographed. Each of the photographed positioning-mark images are converted into video signals by a corresponding CCD image sensor of the CCD camera 80 concerned. The video signals are then suitably processed in the video-signal processing circuit 82. The control system circuit 78 then retrieves the processed video signals and, from this basis, calculates the coordinates of positioning-marks.

After the calculation of the four sets of coordinates [(X11, Y11); (X12, Y12); (X13, Y13); and (X14, Y14)] of the actual workpiece AWP, any positional discrepancies between the actual workpiece AWP and the ideal workpiece IWP are calculated in the system control circuit 78 as follows:

$$\Delta Y=(Y11+Y12+Y13+Y14-Y01-Y02-Y03-Y04)/4$$

$$\Delta X=(X11+X12+X13+X14-X01-X02-X03-X04)/4$$

The calculated data $\Delta Y$ represents a positional discrepancy of the actual workpiece AWP in the main-scanning direction (Y-axis) with respect to the ideal workpiece IWP, and the calculated data $\Delta X$ represents a positional discrepancy of the actual workpiece AWP in the sub-scanning direction (X-axis) with respect to the ideal workpiece IWP. When a circuit pattern is drawn on the surface of the actual workpiece AWP, a drawing-start position in the main-scanning direction is determined on the basis of the discrepancy data $\Delta Y$, and a drawing-start position in the sub-scanning direction is determined on the basis of the discrepancy data $\Delta X$, whereby the circuit pattern can be drawn on the actual workpiece AWP at a proper position thereof.

Note, the discrepancy data $\Delta Y$ and $\Delta X$ are stored in the RAM of the system control circuit 78 for the purpose of controlling the drawing-operation.

According to the present invention, for measurement of dimensional variations or fluctuations of the actual workpiece AWP, a degree of expansion/contraction is calculated on the basis of both the four sets of coordinates of the ideal workpiece IWP and the four sets of coordinates of the actual workpiece AWP as follows:

$$\Delta SY=[(Y13+Y14-Y11-Y12)/(Y03+Y04-Y01-Y02)-1]$$

$$\Delta SX=[(X12+X13-X11-X14)/(X02+X03-X01-X04)-1]$$

The calculated data $\Delta SY$ represents a degree of expansion/contraction of the actual workpiece AWP in the main-scanning direction, and the calculated data $\Delta SX$ represents a degree of expansion/contraction of the actual workpiece AWP in the sub-scanning direction.

If the degree of expansion/contraction in the main-scanning direction is positive, i.e., if $\Delta SY>0$, it indicates that the actual workpiece AWP is expanded along the Y-axis with respect to the corresponding standard dimension (Y) of the ideal workpiece IWP. Also, if ΔSY<0, it indicates that the actual workpiece AWP is contracted along the Y-axis with respect to the corresponding standard dimension (Y) of the ideal workpiece IWP.

Similarly, if the degree of expansion/contraction in the sub-scanning direction is positive, i.e., if ΔSX>0, it indicates that the actual workpiece AWP is expanded along the X-axis with respect to the corresponding standard dimension (X) of the ideal workpiece IWP. Also, if ΔSX<0, it indicates that the actual workpiece AWP is contracted along the X-axis with respect to the corresponding standard dimension (X) of the ideal workpiece IWP.

Note, the expansion/contraction degree data ΔSY and ΔSX are also stored in the RAM of the system control circuit 78 for the purpose of controlling the drawing-operation.

As mentioned hereinbefore, according to the present invention, the scaling-correction is performed with a unit of less than one-pixel size with respect to a circuit pattern to be drawn. Accordingly, if the one-pixel size of the raster-graphic data is represented by "$D_p$", the scaling-correction is performed wit ha unit of $D_p$/n. Note, in this embodiment, "n" is 10. For example, if ten thousand pixels are included in a main-scan line, and if the ten thousand pixels are recorded in the scanning-range of 500 mm, a one-pixel size is 5 μm. In this case, the performance of the scaling-correction is based upon a unit of 0.5 μm.

In the example mentioned above, if a degree of expansion/contraction in the main-scanning direction is +0.002, i.e., if ΔSY=+0.002, the scanning-range of 500 mm is expanded into 501 mm. In this case, it is necessary to perform the scaling-correction in the main-scanning direction for a positive distance of 1 mm corresponding to a number of 200 (100,000×0.002) pixels. In a performance of the scaling-correction, the ten thousand pixels should be, as far as is possible, uniformly recorded in the expanded scanning-range of 501 mm.

To this end, it is possible to perform the scaling-correction for a positive distance of 5 μcorresponding to the one-pixel size every 500 (100,000/20) consecutive pixels. Nevertheless, according to the present invention, since the performance of the scaling-correction is based upon the unit of 0.5 μm, as mentioned above, the scaling-correction can be further preciously performed for a positive distance of 0.5 μm every 50 consecutive pixels. This precision performance of the scaling-correction is made possible by successively and cyclically switching over the outputting of the clock pulses (YCK-SFT1; YCK-SFT2; YCK-SFT3; YCK-SFT4; YCK-SFT5; YCK-SFT6; YCK-SFT7; YCK-SFT8; YCK-SFT9; YCK-SFT10), to thereby delay the output-timing of the sixteen driving-signals from the synchronizing circuit 90B to the electronic shutters 52 and 58 every 50 consecutive pixels.

Figure 10:
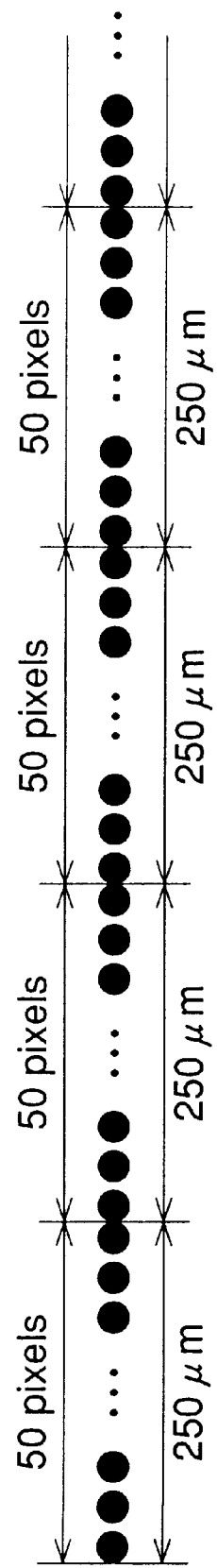
FIG. 10 is a conceptual view showing a series of pixels included in a main-scan line and recorded with a scanning-laser beam in accordance with a series of clock pulses.

In particular, if the output-timing of the sixteen driving-signals to the electronic shutters 52 and 58 is regulated by any one of the ten series of clock pulses: YCK-SFT1; YCK-STF2; YCK-STF3; YCK-STF4; YCK-STF5; YCK-STF6; YCK-STF7; YCK-STF8; YCK-STF9; and YCK-STF10, the ten thousand pixels are uniformly recorded with the scanning-laser beam concerned in the scanning-range of 500 mm, and every 50 consecutive pixels occupies a line segment of 250 (50×5) μm, as shown in FIG. 10.

Figure 11:
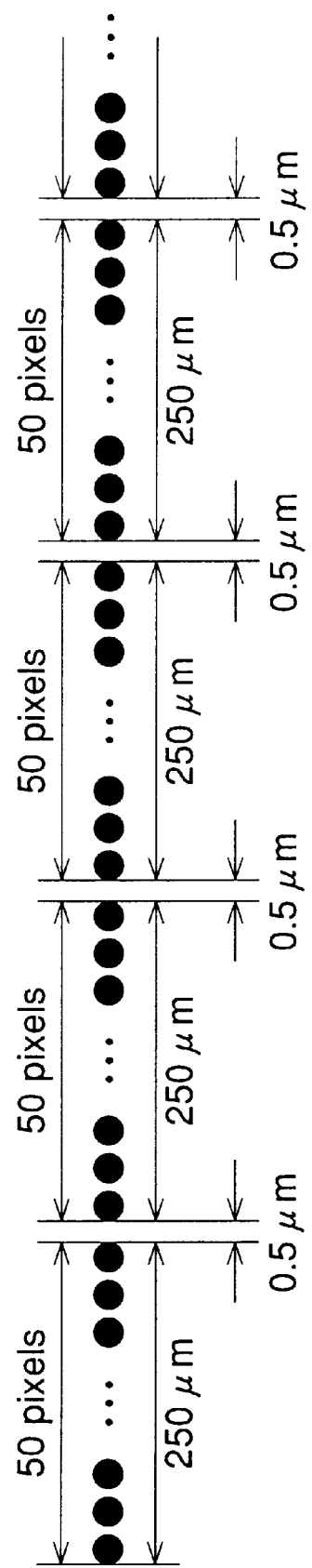
FIG. 11 is a conceptual view showing a series of pixels included in a main-scan line and recorded on the basis of an introduction of a scaling-correction according to the present invention.

On the other hand, whenever the scanning-laser beam concerned is deflected over the distance of 250 μm, the outputting of the clock pulses (YCK-STF1; YCK-STF2; YCK-STF3; YCK-STF4; YCK-STF5; YCK-STF6; YCK-STF7; YCK-STF8; YCK-STF9; YCK-STF10) is successively and cyclically switched over in such a manner that the phase of the outputted clock pulses is delayed by π/5 (FIG. 6), resulting every 50 consecutive pixels being recorded so as to be spaced from each other by a distance of 0.5 μm, as shown in FIG. 11. Thus, the precious scaling-correction is achieved so that the ten thousand pixels can be uniformly recorded in the expanded scanning-range of 501 mm.

On the contrary, in the example mentioned above, if a degree of expansion/contraction in the main-scanning direction is −0.002, i.e., if ΔSY=−0.002, the scanning-range of 500 mm is contracted into 499 mm. In this case, it is necessary to perform the scaling-correction in the main-scanning direction for a negative distance of 1 mm corresponding to a number of 200 (100,000×0.002) pixels. In an operation of the scaling-correction, the ten thousand pixels should be, as far as is possible, uniformly recorded in the contracted scanning range of 499 mm.

Similar to the above-mentioned case, according to the present invention, since the performance of the scaling-correction is based upon the unit of 0.5 μm, the scaling-correction can be further preciously performed for a negative distance of 0.5 μm every 50 consecutive pixels. This precious performance of the scaling-correction is made possible by successively and cyclically switching over the outputting of the clock pulses (YCK-STF1; YCK-STF2; YCK-STF3; YCK-STF4; YCK-STF5; YCK-STF6; YCK-STF7; YCK-STF8; YCK-STF9; YCK-STF10), to thereby advance the output-timing of the sixteen driving-signals from the synchronizing circuit 90B to the electronic shutters 52 and 58 every 50 consecutive pixels.

Figure 12:
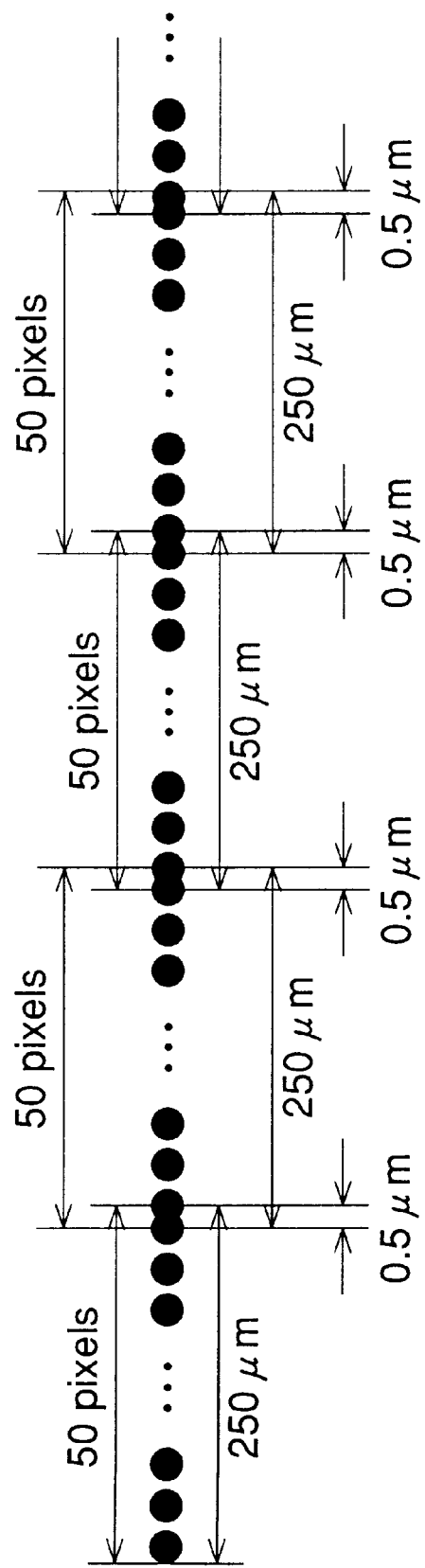
FIG. 12 is a conceptual view showing a series of pixels included in a main-scan line and recorded on the basis of introduction of another scaling-correction according to the present invention.

In particular, whenever the scanning-laser beam concerned is deflected over the distance of 250 μm, the outputting of the clock pulses ((YCK-STF1; YCK-STF2; YCK-STF3; YCK-STF4; YCK-STF5; YCK-STF6; YCK-STF7; YCK-STF8; YCK-STF9; YCK-STF10) is successively and cyclically switched over in such a manner that the phase of the outputted clock pulses is advanced by π/5 (FIG. 6), resulting in the fact that every 50 consecutive pixels are recorded so as to overlap each other by a distance of 0.5 μm, as shown in FIG. 12. Thus, the precious scaling-correction is achieved so that the ten thousand of pixels can be uniformly recorded in the contracted scanning-range of 499 mm.

Although the scaling-correction in the main-scanning direction (Y) is explained with reference to FIGS. 10 to 12, this is essentially true for the scaling-correction in the sub-scanning direction (X) except for the following matters:

(1) the sixteen scanning-laser beams cannot be deflected in the sub-scanning direction (X), but it can be said that the sixteen scanning-laser beams are relatively deflected with respect to the drawing table 18 due to the movement of the drawing table 18 in the sub-scanning direction. Namely, the deflection of the sixteen scanning-laser beams in the sub-scanning direction can be grasped as a relative movement of the sixteen scanning-laser beams with respect to the drawing table 18.

(2) Since the drawing table 18 is moved in the negative direction of the X-axis (sub-scanning direction) during the drawing operation, the scaling-correction is performed for a negative distance when a scanning-range is expanded in the sub-scanning direction, and the scaling-correction is performed for a negative distance when a scanning-range is contracted in the sub-scanning direction. Namely, in the case of ΔSX>0, whenever the scanning-laser beam concerned is relatively deflected over a given distance with respect to the drawing table 18, the outputting of the ten series of clock pulses (XCK-SFT1; XCK-SFT2; XCK-SFT3; XCK-SFT4;

XCK-SFT5; XCK-SFT6; XCK-SFT7; XCK-SFT8; XCK-SFT9; XCK-SFT10) is successively and cyclically switched over in such a manner that the phase of the outputted clock pulses is advanced by $\pi/5$ (FIG. 7). Also, in the case of $\Delta SX<0$, whenever the scanning-laser beam concerned is relatively deflected over a given distance with respect to the drawing table 18, the outputting of the ten series of clock pulses (XCK-SFT1; XCK-SFT2; XCK-SFT3; XCK-SFT4; XCK-SFT5; XCK-SFT6; XCK-SFT7; XCK-SFT8; XCK-SFT9; XCK-SFT10) is successively and cyclically switched over in such a manner that the phase of the outputted clock pulses is delayed by $\pi/5$ (FIG. 7).

As is apparent from the foregoing, a unit of minimum distance ($Y_c$) in the main-scanning direction (Y), for which the precious scaling-correction should be performed with a unit of $D_p/n$ depends upon the expansion/contraction degree data $\Delta SY$, and is represented by the following general formula:

$$Y_c=(D_p/n)/\Delta SY$$

Note, in the above-mentioned example explained with reference to FIG. 10 to 12, $Y_c=(5 \mu m/10)/0.002=250 \mu m$.

Similarly, a unit of minimum distance ($X_c$) in the sub-scanning direction (X), for which the precious scaling-correction should be performed with a unit of $D_p/n$ depends upon the expansion/contraction degree data $\Delta SX$, and may be represented by the following general formula:

$$X_c=(D_p/n)/\Delta SX$$

Also, a phase-shift location ($Y_t$), which is measured from the drawing-start position in the main-scanning direction, and at which the phase of the clock pulses (YCK-SFT1; ~; YCK-SFT10) outputted from multiplexer 84A$_5$ should be shifted for the precious scaling-correction, may be represented by the following formula:

$$Y_t=Y_c*t=[(D_p/n)/\Delta SY]*t$$

Herein: a symbol "*" represents the product; and a symbol "t" represents an integer.

Similarly, a phase-shift location ($X_s$), which is measured from the drawing-start position in the sub-scanning direction, and at which the phase of the clock pulses (XCK-SFT1; ~; XCK-SFT10) outputted from the multiplexer 84B$_5$ should represented by the following formula:

$$X_s=X_c*s=[(D_p/n)/\Delta SX]*s$$

Herein: a symbol "*" represents the product; and a symbol "s" represents an integer.

Note, the above-mentioned calculations are executed in the system control circuit 78, and the resultant data $Y_c$; $X_c$; $Y_t$; and $X_s$ are stored in the RAM thereof. Further, note, other data inclusive of the integers "t" and "s", the one-pixel size "$D_p$", and the constant "n" may be stored in the ROM of the system control circuit 78.

Figure 13:
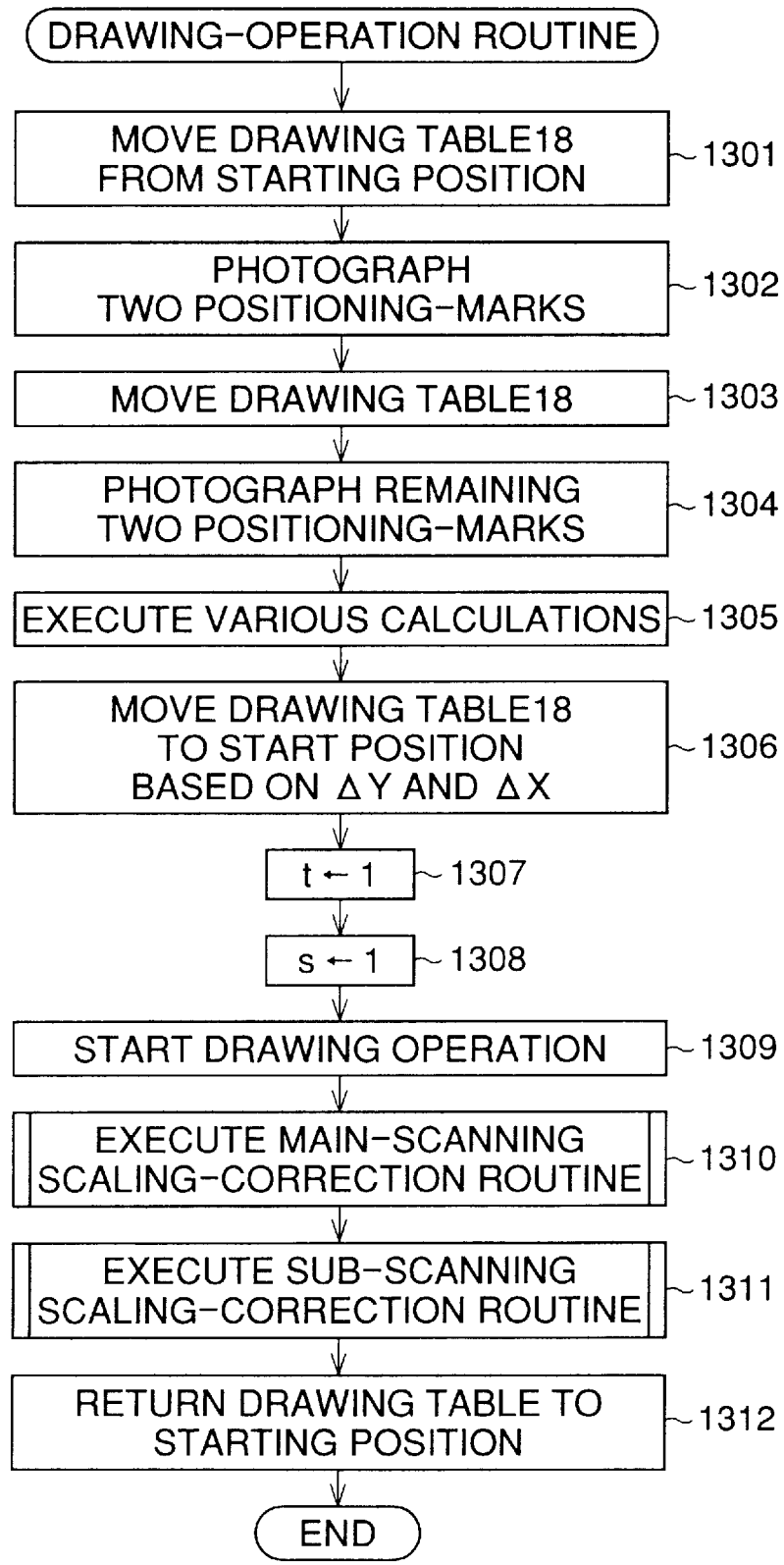
FIG. 13 is a flowchart showing a drawing-operation routine executed in the laser drawing apparatus according to the present invention.

FIG. 13 shows a flowchart for a drawing operation routine executed in the system control circuit 78 of the laser drawing apparatus.

At step 1301, the drawing table 18 is moved from a starting-position thereof along the X-axis of the X-Y coordinate system by driving the servo-motor 98 until two of the four positioning-marks of a workpiece on the placed on the drawing table 18 are observed by the CCD cameras 80. When the positioning-marks are observed by the CCD cameras 80, the drawing table 18 is stopped.

At step 1302, the positioning-marks are photographed by the CCD cameras 80. Namely, the respective photographed positioning-mark images are converted into video signals by the CCD image sensors of the CCD cameras 80. The converted video signals are suitably processed in the video-signal processing circuit 82, and are then retrieved by the system control circuit 78.

At step 1303, the drawing table 18 is again moved in the X-axis direction of the X-Y coordinate system by driving the servo-motor 98 until the remaining two positioning-marks of a workpiece on the placed on the drawing table 18 are observed by the CCD cameras 80. When the remaining two positioning-marks are observed by the CCD cameras 80, the drawing table 18 is stopped.

At step 1304, the remaining two positioning-marks are photographed by the CCD cameras 80. Namely, the respective photographed positioning-mark images are converted into video signals by the CCD image sensors of the CCD cameras 80. The converted video signals are suitably processed in the video-signal processing circuit 82, and are then retrieved by the system control circuit 78.

At step 1305, the various calculations are executed in the system control circuit 78 as follows:

(a) Firstly, to detect a position of the workpiece on the drawing table 18, the four sets of coordinate data of the four positioning-marks formed at the four corners thereof are calculated on the basis of the video signals derived therefrom (FIG. 9). Then, discrepancy data $\Delta Y$ and $\Delta X$ are calculated, based on the comparison between the four sets of coordinate data of the ideal workpiece (IWP) and the four sets of the coordinate data of the actual workpiece concerned. As already mentioned above, the data $\Delta Y$ represents a positional discrepancy of the workpiece concerned in the main-scanning direction (Y-axis), and the data $\Delta X$ represents a positional discrepancy of the workpiece concerned in the sub-scanning direction (X-axis).

(b) Respective expansion/contraction data $\Delta SY$ and $\Delta SX$ in both the main scanning direction and the sub-scanning direction are calculated on the basis of both the four sets of coordinate data of the ideal workpiece and the four sets of coordinate data of the actual workpiece concerned.

(c) Minimum distance unit data $Y_c$ i the main scanning direction, for which the precious scaling-correction should be performed with a unit of $D_p/n$, is calculated on the basis of the expansion/contraction degree data $\Delta SY$, the one-pixel size data $D_p$ and the constant data "n". The minimum distance unit data $X_c$ in the sub-scanning direction, for which the precious scaling-correction should be performed with a unit of $D_p/n$, is calculated on the basis of the expansion/contraction degree data $\Delta SX$, the one-pixel size data $D_p$ and the constant data "n".

(d) Phase-shift location data $Y_t$, which is measured from the drawing-start position in the main-scanning direction, and at which the phase of the clock pulses (YCK-SFT1; ~; YCK-SFT10) outputted from the multiplexer 85A$_5$ should be shifted for the precious scaling-correction, is calculated on the basis of the minimum distance unit data $Y_c$ and the integer data "t". Phase-shift location data $X_s$, which is measured from the drawing-start position in the sub-scanning direction, and at which the phase of the clock pulses (XCK-SFT1; ~; XCK-SFT10) outputted from the multiplexer 84B$_5$ should be shifted for the precious scaling-correction, is calculated on the basis of the minimum distance unit data $X_c$ and the integer data "s".

After the various calculations are completed, control proceeds to step 1306, in which the drawing table 18 is moved to the drawing start-position on the basis of the calculated discrepancy data ΔY and ΔX. Then, at step 1307, a counter t, representing the integer "t", is initialized to "1", and, at step 1308, a counter s representing the integer "s" is, also, initialized to "1".

At step 1309, an execution of a drawing operation is started. Then, control proceeds to step 1310, in which a main-scanning scaling-correction routing is executed, as shown in a flowchart of FIG. 14. After the main-scanning scaling-correction routine is completed once, control proceeds to step 1311, in which a sub-scanning scaling-correction routine is executed, as shown in a flowchart of FIG. 15. After the sub-scanning scaling-correction routine is completed once, control returns from step 1311 to step 1310. Namely, the main-scanning scaling-correction routine and the sub-scanning scaling-correction routine are alternately executed until the drawing operation is entirely completed.

When the completion of the drawing operation is confirmed, control proceeds from the step 1311 to step 1312, in which the drawing table 18 is returned to the starting position thereof. Thus, the execution of the drawing operation routine is completed.

Figure 14:
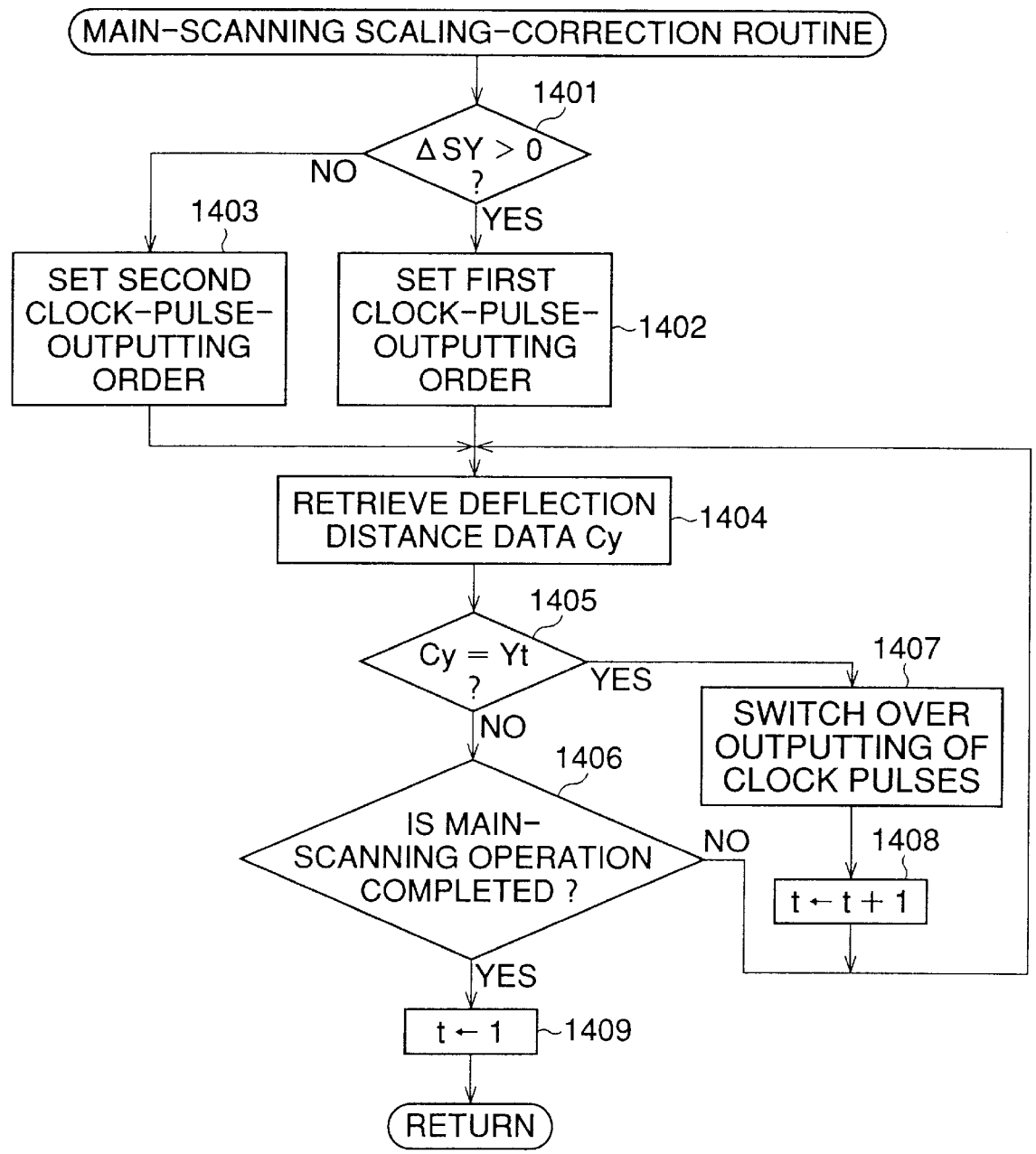
FIG. 14 is a flowchart showing a main-scanning scaling-correction routine executed as a sub-routine in the drawing-operation routine of FIG. 13.

With reference to FIG. 14, the main-scanning scaling-correction routine is explained below.

At step 1401, it is determined whether the degree of expansion/contraction (ΔSY) in the main-scanning direction is positive or negative.

At step 1401, if ΔSY>0, control proceeds to step 1402, in which a first clock-pulse-outputting order is set. In accordance with the first-clock-outputting order, the ten series of clock pulses: YCK-STF1; YCK-STF2; YCK-STF3; YCK-STF4; YCK-STF5; YCK-STF6; YCK-STF7; YCK-STF8; YCK-STF9; and YCK-STF10 are successively and cyclically outputted in such a manner that the phase of the outputted clock pulses is delayed by π/5.

On the other hand, at step 1401, if ΔSY<0, the control proceeds to step 1403, in which a second clock-pulse-outputting order is set. In accordance with the second clock-pulse-outputting order, the ten series of clock pulses: YCK-STF1; YCK-STF2; YCK-STF3; YCK-STF4; YCK-STF5; YCK-STF6; YCK-STF7; YCK-STF8; YCK-STF9; and YCK-STF10 are successively and cyclically outputted in such a manner that the phase of the outputted clock pulses is advanced by π/5.

At step 1404, deflection distance data $C_y$ is retrieved from the Y-scale sensor 94 by the system control circuit 78. The deflection distance data $C_y$ represents a distance over which the sixteen laser beams are deflected from the scanning-start position in the main-scanning direction, at the time when the deflection distance data $C_y$ is retrieved.

At step 1405, it is determined whether the retrieved deflection distance data $C_y$ has coincided with the phase-shift location data $Y_t$. Note, at this stage, since a count number of the counter t is "1", the phase-shift location data $Y_t$ is equal to $Y_c*1$. Note, in the above-mentioned example, data $Y_c$ is 250 μm. If $C_y \neq Y_t$, control proceeds from 1405 to step 1406, in which it is determined whether an initial pass of the main-scanning operation of the workpiece, with the sixteen laser beams, has been completed.

If the entire main-scanning operation is not yet completed, control returns from step 1406 to step 1404. At step 1405, when the retrieved deflection distance data $C_y$ has coincided with the phase-shift location data $Y_t$, control proceeds from step 1405 to step 1407.

If ΔSY>0 at step 1401, i.e., if the first clock-pulse-outputting order is set, at step 1407, the outputting of the clock pulses (YCK-STF1; YCK-STF2; YCK-STF3; YCK-STF4; YCK-STF5; YCK-STF6; YCK-STF7; YCK-STF8; YCK-STF9; YCK-STF10) is switched over in accordance with the first clock-pulse-outputting order. Namely, the switching of the outputting of the clock pulses is carried out in such a manner that the phase of the outputted clock pulses is delayed by π/5. For example, if the first clock pulses YCK-SFT1 is initially outputted, the outputting of the clock pulses is switched over from the first clock pulses YCK-SFT1 to the second clock pulses YCK-SFT2.

On the other hand, if ΔSY<0 at step 1401, i.e., if the second clock-pulse-outputting order is set, at step 1407, the outputting of the clock pulses (YCK-STF1; YCK-STF2; YCK-STF3; YCK-STF4; YCK-STF5; YCK-STF6; YCK-STF7; YCK-STF8; YCK-STF9; YCK-STF10) is switched over in accordance with the second clock-pulse-outputting order. Namely, the switching of the outputting of the clock pulses is carried out in such a manner that the phase of the outputted clock pulses is advanced by π/5. For example, if the first clock pulses YCK-SFT1 is initially outputted, the outputting of the clock pulses is switched over from the first clock pulses YCK-SFT1 to the tenth clock pulses YCK-SFT10.

At step 1408, the count number of the counter t is incremented by "1", and then control returns to step 1404. Namely, the routine comprising steps 1404, 1405, 1406, 1407, and 1408 is repeatedly executed until the entire main-scanning operation is completed once. Thus, if ΔSY>0 at step 1401, the precious scaling-correction is performed in the manner as explained with reference to FIG. 11, and, if ΔSY<0 at step 1401, the precious scaling-correction is performed in the manner with reference to FIG. 12. When the completion of the main-scanning operation is confirmed in step 1401, the counter "λ" is reset to 1 and control returns to step 1311 of the flowchart of FIG. 13.

Figure 15:
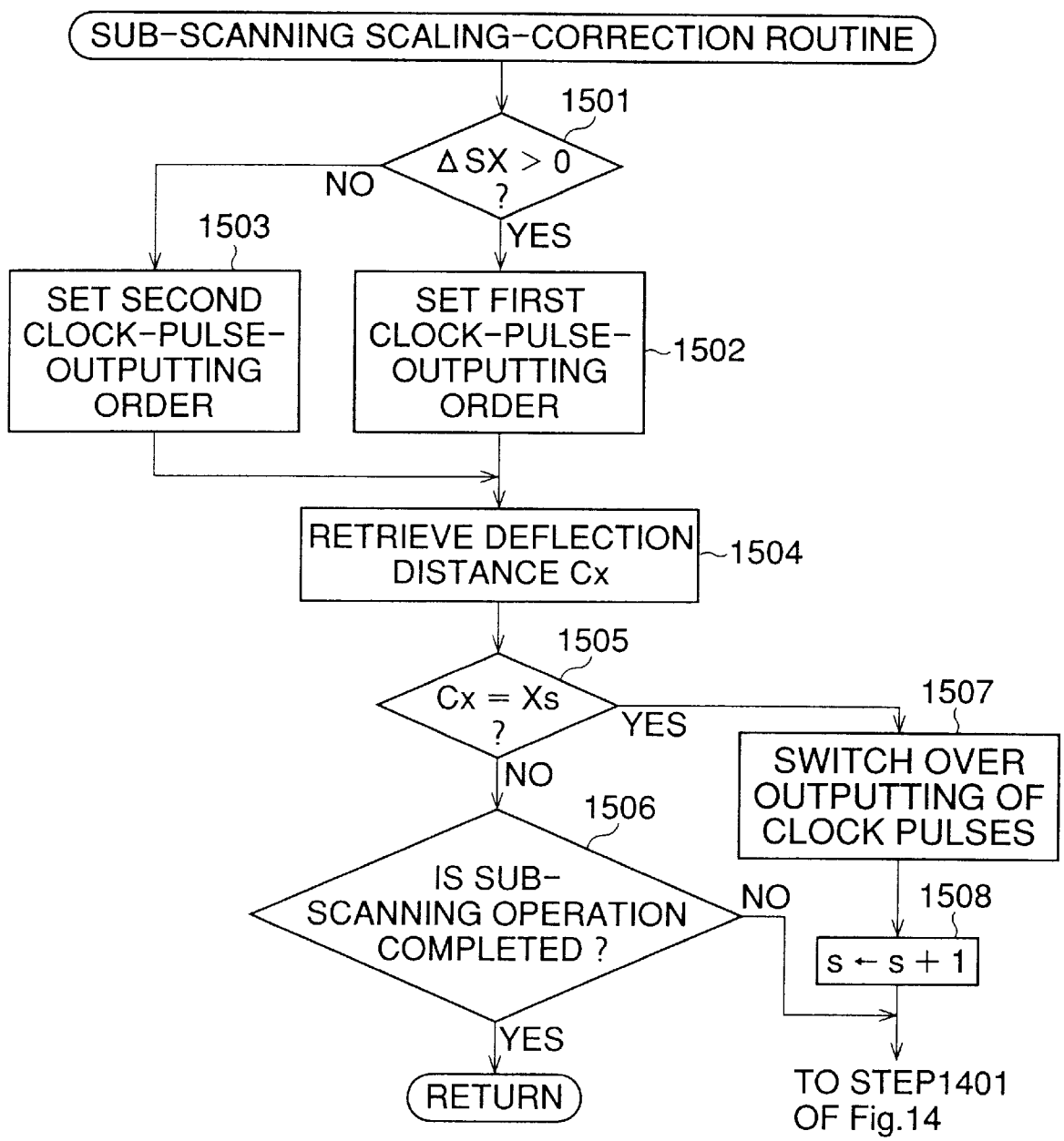
FIG. 15 is a flowchart showing a sub-scanning scaling-correction routine executed as a sub-routine in the drawing-operation routine of FIG. 13.

With reference to FIG. 15, the sub-scanning scaling-correction routine is explained below.

At step 1501, it is determined whether the degree of expansion/contraction (ΔSX) in the sub-scanning direction is positive or negative.

At step 1501, if ΔSX>0, control proceeds to step 1502, in which a first clock-pulse-outputting order is set. In accordance with the first-clock-outputting order, the ten series of clock pulses: XCK-STF1; XCK-STF2; XCK-STF3; XCK-STF4; XCK-STF5; XCK-STF6; XCK-STF7; XCK-STF8; XCK-STF9; and XCK-STF10 are successively and cyclically outputted in such a manner that the phase of the outputted clock pulses is advanced by π/5.

On the other hand, at step 1501, if ΔSX<0, control proceeds to step 1503, in which a second clock-pulse-outputting order is set. In accordance with the second clock-pulse-outputting order, the ten series of clock pulses: XCK-SFT1; XCK-STF2; XCK-STF3; XCK-STF4; XCK-STF5; XCK-STF6; XCK-STF7; XCK-STF8; XCK-STF9; XCK-STF10 are successively and cyclically outputted in such a manner that the phase of the outputted clock pulses is delayed by π/5.

At step 1504, deflection distance data $C_x$ is retrieved from the X-scale sensor 94 by the system control circuit 78. The deflection distance data $C_x$ represents a distance over which the sixteen laser beams are relatively deflected with respect to the drawing table 18 from the scanning-start position in the sub-scanning direction, at the time when the deflection distance data $C_x$ is retrieved.

At step 1505, it is determined whether the retrieved deflection distance data $C_x$ has coincided with the phase-shift location data $X_s$. Note, at this stage, since a count number of the counter s is "1", the phase-shift location data $X_s$ is equal to $X_c*1$. If $C_x \neq X_s$, control proceeds from step 1505 to step 1506, in which it is determined whether a sub-scanning operation of the workpiece, with the sixteen laser beams, is completed.

Since sub-scanning operation is not yet completed, control returns to step 1401 of the flowchart of FIG. 14, in which the main-scanning scaling-correction routine is again executed.

At step 1505, when the fetched deflection distance data $C_x$ coincides with the phase-shift location $X_s$, control proceeds from step 1505 to step 1507.

If $\Delta SX>0$ at step 1501, i.e., if the first clock-pulse-outputting order is set, at step 1507, the outputting of the clock pulses (XCK-STF1; XCK-STF2; XCK-STF3; XCK-STF4; XCK-STF5; XCK-STF6; XCK-STF7; XCK-STF8; XCK-STF9; XCK-STF10) is switched over in accordance with the first clock-pulse-outputting order. Namely, the switching of the outputting of the clock pulses is carried out in such a manner that the phase of the outputted clock pulses is advanced by $\pi/5$. For example, if the first clock pulses XCK-SFT1 is initially outputted, the outputting of the clock pulses is switched over from the first clock pulses XCK-SFT1 to the tenth clock pulses XCK-SFT10.

On the other hand, if $\Delta SX<0$ at step 1505, i.e., if the second clock-pulse-outputting order is set, at step 1507, the outputting of the clock pulses (XCK-STF1; XCK-STF2; XCK-STF3; XCK-STF4; XCK-STF5; XCK-STF6; XCK-STF7; XCK-STF8; XCK-STF9; XCK-STF10) is switched over in accordance with the second clock-pulse-outputting order. Namely, the switching of the outputting of the clock pulses is carried out in such a manner that the phase of the outputted clock pulses is delayed by $\pi/5$. For example, if the first clock pulses XCK-SFT1 is initially outputted, the outputting of the clock pulses is switched over from the first clock pulses XCK-SFT1 to the second clock pulses XCK-SFT2.

At step 1508, the count number of the counter s is incremented by "1", and then control returns to step 1401 of the flowchart of FIG. 14, in which the main-scanning scaling-correction routine is again executed.

Thus, the precious scaling-correction is introduced into the sub-scanning operation in substantially the same manner as the main-scanning operation. When the completion of the sub-scanning operation is confirmed at step 1506, control returns to step 1312 of the flowchart of FIG. 13.

Finally, it will be understood by those skilled in the art that the foregoing description is of preferred embodiments of the apparatus and that various changes and modifications may be made to the present invention without departing from the spirit and scope thereof.

The present disclosure relates to subject matter contained in Japanese Patent Application No. 8-163697 (filed on Jun. 4, 1996), which is expressly incorporated herein, by reference, in its entirety.

We claim:

1. A laser drawing apparatus for drawing a pattern on a surface of a workpiece by scanning the workpiece surface with at least one laser beam and by modulating at least one laser beam on a basis of raster-graphic data, in accordance with a series of clock pulses, said apparatus comprising:

a detector that detects a dimensional variation of the workpiece in a scanning direction of the laser beam with respect to a standard dimension;

a calculator that calculates a degree of variation between a dimension of the workpiece and the standard dimension; and a regulator that cyclically shifts a phase of the clock pulses by a unit of less than $2\pi$, in such a manner that a pattern to be drawn on the workpiece is dimensionally varied, in accordance with the degree of variation of the workpiece.

2. A laser drawing apparatus as set forth in claim 1, wherein said detector comprises:

an image sensor that optically and electronically senses a mark of the workpiece with respect to a coordinate system, defined in a plane in which the workpiece surface is included, to thereby produce video signals carrying the mark thereof, said coordinate system defining the standard dimension; and a video-signal processor that processes the video signals to as to obtain the dimensional variation of the workpiece in the scanning direction with respect to the standard dimension defined in said coordinate system.

3. A laser drawing apparatus as set forth in claim 1, wherein said calculator calculates the degree of variation between the dimension of the workpiece and the standard dimension as a degree of expansion/contraction of the workpiece in the scanning direction with respect to the standard dimension.

4. A laser drawing as set forth in claim 3, further comprising a determiner that determines one of a positive and negative degree of expansion/contraction of the workpiece.

5. A laser drawing apparatus as set forth in claim 4, wherein said regulator regulates a cyclic shift of the phase of the clock pulses in such a manner that the pattern to be drawn on the workpiece is dimensionally scaled-up when said determinator determines that the degree of expansion/contraction of the workpiece is positive, the pattern to be drawn on the workpiece being dimensionally scaled-down when said determinator determines that the degree of expansion/contraction of the workpiece is negative.

6. A laser drawing apparatus for drawing a pattern on a surface of a workpiece by scanning the workpiece surface with at least one laser beam and by modulating at least one laser beam on the basis of raster-graphic data, in accordance with a series of clock pulses, the workpiece being scanned with the laser beam by deflecting the laser beam with respect to the workpiece, said apparatus comprising:

a detector that detects a dimensional variation of the workpiece in a scanning direction of the laser beam with respect to a standard dimension;

a calculator that calculates a degree of variation between a dimension of the workpiece and the standard dimension;

a determiner that determines whether the degree of variation of the workpiece is positive or negative with respect to the standard dimension;

a first regulator that cyclically shifts a phase of the clock pulses to be delayed by a unit of less than $2\pi$, upon determining by said determiner that the degree of variation of the workpiece is positive, whereby the pattern to be drawn on the workpiece is dimensionally scaled-up in accordance with the positive degree of variation of the workpiece; and a second regulator that cyclically shifts a phase of the clock pulses to be advanced by a unit of less than $2\pi$, upon determining by said determinator that the degree of variation of the workpiece is negative, whereby the pattern to be drawn on the workpiece is dimensionally scaled-down in accordance with the negative degree of variation of the workpiece.

7. A laser drawing apparatus as set forth in claim 6, wherein said detector comprises:

an image sensor that optically and electronically senses a mark of the workpiece with respect to a coordinate system, defined in a plane in which the workpiece surface is included, to thereby produce video signals carrying the mark thereof, said coordinate system defining the standard dimension; and a video-signal processor that processes the video signals so as to obtain the variation of the workpiece in the scanning direction with respect to the standard dimension defined by the coordinate system.

8. A laser drawing apparatus as set forth in claim 6, wherein said calculator calculates the degree of variation between the dimension of the workpiece and the standard dimension as a degree of expansion/contraction of the workpiece in the scanning direction with respect to the standard dimension.

9. A laser drawing apparatus for drawing a pattern on a surface of a workpiece by scanning the workpiece surface with at least one laser beam and by modulating at least one laser beam on the basis of raster-graphic data, in accordance with a series of clock pulses, the workpiece being scanned with the laser beam by moving the workpiece with respect to the laser beam, said apparatus comprising:

a detector that detects a dimensional variation of the workpiece in a scanning direction of the laser beam with respect to a standard dimension;

a calculator that calculates a degree of variation between the dimension of the workpiece and the standard dimension;

a determinator that determines one of a position and negative degree of variation of the workpiece with respect to the standard dimension;

a first regulator that cyclically shifts a phase of the clock pulses to be advanced with a unit of less than $2\pi$, upon determining by said determiner that the degree of variation of the workpiece is positive, the pattern to be drawn on the workpiece being dimensionally scaled-up, in accordance with the positive degree of variation of the workpiece; and a second regulator that cyclically shifts a phases of the clock pulses to be delayed by a unit of less than $2\pi$, upon determining by said determiner that the degree of variation of the workpiece is negative, the pattern to be drawn on the workpiece being dimensionally scaled-down in accordance with the negative degree of variation of the workpiece.

10. A laser drawing apparatus as set forth in claim 9, wherein said detector comprises:

an image sensor that optically and electronically senses a mark of the workpiece with respect to a coordinate system, defined in a plane in which the workpiece surface is included, to thereby produce video signals carrying the mark thereof, said coordinate system defining the standard dimension; and a video-signal processor that processes the video signals to obtain the dimensional variation of the workpiece in the scanning direction with respect to the standard dimension defined by the coordinate system.

11. A laser drawing apparatus as set forth in claim 9, wherein said calculator calculates the degree of variation between the dimension of the workpiece and the standard dimension as a degree of expansion/contraction of the workpiece in the scanning direction with respect to the standard dimension.

12. A laser drawing apparatus for drawing a pattern on a surface of a workpiece by scanning the workpiece surface with at least one laser beam and by modulating at least one laser beam on the basis of raster-graphic data, in accordance with a series of clock pulses, the workpiece being scanned with the laser beam by deflecting the laser beam with respect to the workpiece, said apparatus comprising:

a detector that detects a dimensional variation of the workpiece in a scanning direction of the laser beam with respect to a standard dimension;

a calculator that calculates a degree of variation between the dimension of the workpiece and the standard dimension;

a determiner that determines one of a positive and negative degree of variation of the workpiece with respect to the standard dimension; and a regulator that cyclically shifts a phase of the clock pulses by a unit of less than $2\pi$ in such a manner that the pattern to be drawn on the workpiece is dimensionally varied, in accordance with one of the positive degree and negative degree of variation of the workpiece, as determined by said determiner, wherein said regulator regulates the cyclic shift of the phase of the clock pulses to one of cause a delay in the phase of the clock pulses in such a manner that the pattern to be drawn on the workpiece is dimensionally scaled-up when said determiner determines that the degree of variation of the workpiece is positive and to cause an advance in the phase of the clock pulses in such a manner that the pattern to be drawn on the workpiece is dimensionally scaled-down when said determiner determines that the degree of variation the workpiece is negative.

13. A laser drawing apparatus as set forth in claim 12, wherein said detector comprises:

said image sensor that optically and electronically senses a mark of the workpiece with respect to a coordinate system, defined in a plane in which the workpiece surface is included, to produce video signals carrying the mark thereof, said coordinate system defining the standard dimension; and a video-signal processor that processes the video signals so as to obtain the variation of the workpiece in the scanning direction with respect to the standard dimension defined by the coordinate system.

14. A laser drawing apparatus as set forth in claim 12, wherein said calculator calculates the degree of variation between the dimension of the workpiece and the standard dimension as a degree of expansion/contraction of the workpiece in the scanning direction with respect to the standard dimension.

15. A laser drawing apparatus as set forth in claim 12, wherein said regulator comprises:

a clock pulse generator that produces at least two series of clock pulses on the basis of a series of basic clock pulses, the respective series of clock pulses having phases which are shifted from each other;

a switcher that selectively outputs any one of the at least two series of clock pulses from said clock pulse generator; and a controller that controls said switcher to output at least two series of clock pulses therefrom in one of a first clock-pulse-outputting order to cause a cyclic delay in the phase of the outputted clock pulses or a second clock-pulse-outputting order to cause a cyclic advance in the phase of the outputted clock pulses, wherein, upon determining by said determiner that the degree of variation of the workpiece is positive, said controller controls said switcher to output at least two series of clock pulses therefrom in said first clock-pulse-outputting order, and wherein, upon determining by said determiner that the degree of variation of the workpiece is negative, said controller controls said switcher to output at least two series of clock pulses therefrom in said second-pulse-outputting order.

16. A laser drawing apparatus for drawing a pattern on a surface of a workpiece by scanning the workpiece surface with at least one laser beam and by modulating at least one laser beam on the basis of raster-graphic data, in accordance with a series of clock pulses, the workpiece being scanned with the laser beam by moving the workpiece with respect to the laser beam, said apparatus comprising:

a detector that detects a dimensional variation of the workpiece in a scanning direction of the laser beam with respect to a standard dimension;

a calculator that calculates a degree of variation between the dimension of the workpiece and the standard dimension;

a determiner that determines one of a positive or negative degree of variation of the workpiece with respect to the standard dimension; and a regulator that cyclically shifts a phase of the clock pulses by a unit of less than $2\pi$ in such a manner that the pattern to be drawn on the workpiece is dimensionally varied, in accordance with said one of said positive degree and negative degree of variation of the workpiece, determined by said determiner, wherein said regulator regulates the cyclic shift of the phase of the clock pulses to cause one of an advance in the phase of the clock pulses in such a manner that the pattern to be drawn on the workpiece is dimensionally scaled-up when said determiner determines that the degree of variation of the workpiece is positive and to cause a delay in the phase of clock pulses in such a manner that the pattern to be drawn on the workpiece is dimensionally scaled-down when said determiner determines that the degree of variation the workpiece is negative.

17. A laser drawing apparatus as set forth in claim 16, wherein said detector comprises:

an image sensor that optically and electronically senses a mark of the workpiece with respect to a coordinate system, defined in a plane in which the workpiece surface is included, to thereby produce video signals carrying the mark thereof, said coordinate system defining the standard dimension; and a video-signal processor that processes the video signals to obtain the dimensional variation of the workpiece in the scanning direction with respect to the standard dimension defined by the coordinate system.

18. A laser drawing apparatus as set forth in claim 16, wherein said calculator calculates the degree of variation between the dimension of the workpiece and the standard dimension as a degree of expansion/contraction of the workpiece in the scanning direction with respect to the standard dimension.

19. A laser drawing apparatus as set forth in claim 16, wherein said regulator comprises:

a clock pulse generator that produces at least two series of clock pulses on the basis of a series of basic clock pulses, the respective series of clock pulses having phases which are shifted from each other;

a switcher that selectively outputs any one of the at least two series of clock pulses from said clock pulse generator; and a controller that controls said switcher so as to output the at least two series of clock pulses therefrom in one of a first clock-pulse-outputting order to cause a cyclic advance in the phase of the outputted clock pulses and a second clock-pulse-outputting order to cause a cyclic delay in the phase of the outputted clock pulses, wherein, upon determining by said determiner that the degree of variation of the workpiece is positive, said controller controls said switcher to output the at least two series of clock pulses therefrom in said first clock-pulse-outputting order, and wherein, upon determining by said determiner that the degree of variation of the workpiece is negative, said controller controls said switcher to output the at least two series of clock pulses therefrom in said second clock-pulse-outputting order.

20. A laser drawing apparatus for drawing a pattern on a surface of a workpiece by scanning the workpiece surface with at least one laser beam in both a main-scanning direction and in a sub-scanning direction, the at least one laser beam modulated on the basis of raster-graphic data, the scanning of the workpiece with the at least one laser beam in the main-scanning direction being carried out by deflecting the at least one laser beam with respect to the workpiece, in accordance with a first series of clock pulses, the scanning of the workpiece with the at least one laser beam in the sub-scanning direction being carried out by moving the workpiece with respect to the at least one laser beam, in accordance with a second series of clock pulses, said apparatus comprising:

a detector that detects dimensional variations of the workpiece in both the main-scanning direction and the sub-scanning direction of the at least one laser beam with respect to standard dimensions;

a calculator that calculates respective degrees of variation between the dimensions of the workpiece, in both the main-scanning direction and the sub-scanning direction, and the standard dimensions;

a first determiner that determines one of a positive and negative degree of variation of the workpiece, in the main-scanning direction, with respect to a corresponding standard dimension;

a first regulator that cyclically shifts a phase of the first series of clock pulses by a unit of less than $2\pi$ in such a manner that the pattern to be drawn on the workpiece is dimensionally varied, in accordance with said one of said positive degree and negative degree of variation of the workpiece, determined by said first determiner, in the main-scanning direction;

a second determiner that determines one of a positive and negative degree of variation of the workpiece, in the sub-scanning direction with respect to the corresponding standard dimension; and a second regulator that cyclically shifts a phase of the second series of clock pulses by a unit of less than $2\pi$ in such a manner that the pattern to be drawn on the workpiece is dimensionally varied, in accordance with said one of said positive degree and negative degree variation of the workpiece, determined by said second determine, in the sub-scanning direction.

21. A laser drawing apparatus as set forth in claim 20, wherein said detector comprises:

an image sensor that optically and electronically senses a mark of the workpiece with respect to a coordinate system, defined in a plane in which the workpiece surface is included, to produce video signals carrying the mark thereof, said coordinate system defining the standard dimension; and a video-signal processor that processes the video signals to obtain the variation of the workpiece in the scanning direction with respect to the standard dimension defined by the coordinate system.

22. A laser drawing apparatus as set forth in claim 20, wherein said calculator calculates the degree of variation between the dimension of the workpiece and the standard dimension as a degree of expansion/contraction of the workpiece in the scanning direction with respect to the standard dimension.

23. A laser drawing apparatus as set forth in claim 20, wherein said first regulator comprises:

a clock pulse generator that produces at least two series of clock pulses on the basis of a series of basic clock pulses, the respective series of clock pulses having phases which are shifted from each other;

a switcher that selective outputs any one of the at least two series of clock pulses as the first series of clock pulses from said clock pulse generator; and a controller that controls said switcher to output the at least two series of clock pulses therefrom in one of a first clock-pulse-outputting order to cause a cyclic delay in the phase of the outputted clock pulses and a second clock-pulse-outputting order to cause a cyclic advance in the phase of the outputted clock pulses, wherein, upon determining by said determiner that the degree of variation of the workpiece in the main-scanning direction is positive, said controller controls said switcher so as to output the at least two series of clock pulses therefrom in said first clock-pulse-outputting order, and wherein, upon determining by said first determiner that the degree of variation of the workpiece in the main-scanning direction is negative, said controller controls said switcher so as to output the at least two series of clock pulses therefrom in said second clock-pulse-outputting order.

24. A laser drawing apparatus as set forth in claim 20, wherein said second regulator comprises:

a clock pulse generator that produces at least two series of clock pulses on the basis of a series of basic clock pulses, the respective series of clock pulses having phases which are shifted from each other;

a switcher that selective outputs any one of the at least two series of clock pulses as the second series of clock pulses from said clock pulse generator; and a controller that controls said switcher to output the at least two series of clock pulses therefrom in one of a first clock-pulse-outputting order to cause a cyclic delay in the phase of the outputted clock pulses and a second clock-pulse-outputting order to cause a cyclic advance in the phase of the outputted clock pulses, wherein, upon determining by said second determiner that the degree of variation of the workpiece in the sub-scanning direction is positive, said controller controls said switcher to output the at least two series of clock pulses therefrom in said first clock-pulse-outputting order, and wherein, upon determining by said first determiner that the degree of variation of the workpiece in the sub-scanning direction is negative, said controller controls said switcher to output the at least two series of clock pulses therefrom in said second clock-pulse-outputting order.

25. A laser drawing apparatus for drawing a pattern on a surface of a workpiece by scanning the workpiece surface with at least one laser beam and by modulating the at least one laser beam on the basis of raster-graphic data, in accordance with a series of clock pulses, said apparatus comprising:

means for detecting a dimensional variation of the workpiece in a scanning direction of the at least one laser beam with respect to a standard dimension;

means for calculating a degree of variation between the dimension of the workpiece and the standard dimension; and regulating means for cyclically shifting a phase of the clock pulses by a unit of less than $2\pi$ in such a manner that a pattern to be drawn on the workpiece is dimensionally varied, in accordance with the degree of variation of the workpiece.

26. A laser drawing apparatus as set forth in claim 25, wherein said detecting means comprises:

image sensor means for optically and electronically sensing a mark of the workpiece with respect to a coordinate system, defined in a plane in which the workpiece surface is included, to thereby produce video signals carrying the mark thereof, said coordinate system defining the standard dimension; and video-signal processor means for processing the video signals to obtain the dimensional variation of the workpiece in the scanning direction with respect to the standard dimension defined in said coordinate system.

27. A laser drawing apparatus as set forth in claim 25, wherein said calculating means calculates the degree of variation between the dimension of the workpiece and the standard dimension as a degree of expansion/contraction of the workpiece in the scanning direction with respect to the standard dimension.

28. A laser drawing apparatus as set forth in claim 27, further comprising means for determining one of a positive and negative degree of expansion/contraction of the workpiece.

29. A laser drawing apparatus as set forth in claim 28, wherein said regulating means regulates a cyclic shift of the phase of the clock pulses in either a manner that the pattern to be drawn on the workpiece is dimensionally scaled-up when said determining means determines that the degree of expansion/contraction of the workpiece is positive, said regulating means regulating the cyclic shift of the phase of the clock pulses in such a manner that the pattern to be drawn on the workpiece is dimensionally scaled-down when said determining means determines that the degree of expansion/contraction of the workpiece is negative.

30. A laser drawing apparatus for drawing a pattern on a surface of a workpiece by scanning the workpiece surface with at least one laser beam and by modulating the at least one laser beam on the basis of raster-graphic data, in accordance with a series of clock pulses, the workpiece being scanned with the at least one laser beam by deflecting the at least one laser beam with respect to the workpiece, said apparatus comprising:

means for detecting a dimensional variation of the workpiece in a scanning direction of the laser beam with respect to a standard dimension;

means for calculating a degree of variation between the dimension of the workpiece to the standard dimension; and means for determining one of a positive and negative degree of variation of the workpiece with respect to the standard dimension;

first regulation means cyclically shifting a phase of the clock pulses so as to be delayed by a unit of less than 2 π, upon determining by said determining means that the degree of variation of the workpiece is positive, whereby the pattern to be drawn on the workpiece is dimensionally scaled-up in accordance with the positive degree of the dimensional variation of the workpiece; and second regulating means for cyclically shifting a phase of the clock pulses so as to be advanced by a unit of less than 2 π, upon determining by said determining means that the degree of variation of the workpiece is negative, whereby the pattern to be drawn on the workpiece is dimensionally scaled-down in accordance with the negative degree of the dimensional variation of the workpiece.

31. A laser drawing apparatus as set forth in claim 30, wherein said detecting means comprises:

image sensor means for optically and electronically sensing a mark of the workpiece with respect to a coordinate system, defined in a plane in which the workpiece surface is included, to thereby produce video signals carrying the mark thereof, said coordinate system defining the standard dimension; and video-signal processor means for processing the video signals so as to obtain the dimensional variation of the workpiece in the scanning direction with respect to the standard dimension defined by the coordinate system.

32. A laser drawing apparatus as set forth in claim 30, wherein said calculating means calculates the degree of variation between the dimension of the workpiece and the standard dimension as a degree of expansion/contraction of the workpiece in the scanning direction with respect to the standard dimension.

33. A laser drawing apparatus for drawing a pattern on a surface of a workpiece by scanning a workpiece surface with at least one laser beam and by modulating said at least one laser beam on the basis of raster-graphic data, in accordance with a series of clock pulses, said workpiece surface being scanned by said at least one laser beam by moving said workpiece surface with respect to said at least one laser beam, said apparatus comprising:

means for detecting a dimensional variation of said workpiece surface in a scanning direction of said at least one laser beam with respect to a standard dimension;

means for calculating a degree of variation between a dimension of said workpiece surface and said standard dimension;

means for determining whether a degree of said dimensional variation of said workpiece surface is positive or negative with respect to said standard dimension;

first regulation means for cyclically shifting a phase of said series of clock pulses so as to be advanced with a unit of less than 2 π, when said determining means determines that said degree of said dimensional variation of said workpiece surface is positive, whereby said pattern to be drawn on said workpiece surface is dimensionally scaled-up, in accordance with said positive degree of said dimensional variation of said workpiece surface; and second regulating means for cyclically shifting said phase of said series of clock pulses so as to be delayed by a unit of less than 2 π, when said determining means determines that said degree of said dimensional variation of said workpiece surface is negative, whereby said pattern to be drawn on said workpiece is dimen-sionally scaled-down in accordance with said negative degree of said dimensional variation of said workpiece surface.

34. A laser drawing apparatus as set forth in claim 33, wherein said detecting means comprises:

means for optically and electronically sensing a mark of said workpiece surface with respect to a coordinate system, defined in a plane in which said workpiece surface is included, to thereby produce video signals carrying said mark thereof, said coordinate system defining said standard dimension; and means for processing said video signals to obtain said dimensional variation of said workpiece surface in said scanning direction with respect to said standard dimension defined by said coordinate system.

35. A laser drawing apparatus as set forth in claim 33, wherein said calculating means calculates said degree of variation between said dimension of said workpiece surface and said standard dimension as a degree of expansion/contraction of said workpiece surface in said scanning direction with respect to said standard dimension.

36. A laser drawing apparatus for drawing a pattern on a surface of a workpiece by scanning said workpiece surface with at least one laser beam and by modulating said at least one laser beam on a basis of raster-graphic data, in accordance with a series of clock pulses, said workpiece surface being scanned with said at least one laser beam by deflecting a dimension variation of said workpiece surface in a scanning direction said laser beam with respect to a standard dimension;

means for calculating a degree of dimensional variation between the dimension of said workpiece surface and said standard dimension;

means for determining whether said degree of dimensional variation of said workpiece surface is positive or negative with respect to said standard dimension; and means for cyclically shifting a phase of said series of clock pulses by a unit of less than 2 π in such a manner that a pattern to be drawn on said workpiece surface is dimensionally varied, in accordance with either said positive or negative degree of dimensional variation of said workpiece surface, as determined by said determining means, wherein said cyclically shifting means regulates said cyclic shift of said phase of said series of clock pulses to cause one of a delay in said phase of said series of clock pulses, in such a manner that said pattern to be drawn on said workpiece surface is dimensionally scaled-up when said determining means determines that said degree of dimensional variation of said workpiece surface is positive, or to cause an advance in said phase of said series of clock pulses in such a manner that said pattern to be drawn on said workpiece surface is dimensionally scaled-down when said determining means determines that said degree of dimensional variation of said workpiece surface is negative.

37. A laser drawing apparatus as set forth in claim 36, wherein said detecting means comprises:

means for optically and electronically sensing a mark of said workpiece surface with respect to a coordinate system, defined in a plane in which said workpiece surface is included, to produce video signals carrying said mark thereof, said coordinate system defining said standard dimension; and means for processing said video signals to obtain said dimensional variation of said workpiece surface in said scanning direction with respect to said standard dimension defined by said coordinate system.

38. A laser drawing apparatus as set forth in claim 36, wherein said calculating means calculates said degree of variation between said dimension of said workpiece surface and said standard dimension as a degree of expansion/contraction of said workpiece surface in said scanning direction with respect to said standard dimension.

39. A laser drawing apparatus as set forth in claim 36, wherein said regulating means comprises:

- means for producing at least two series of clock pulses on a basis of a series of basic clock pulses, respective series of clock pulses having phases shifted from each other;
- a switcher that selectively outputs any one of said at least two series of clock pulses from said means; and
- means for controlling said switcher to output said at least two series of clock pulses in one of a first clock-pulse-outputting order, to cause a cyclic delay in a phase of said outputted clock pulses, or a second clock-pulse-outputting order, to cause a cyclic advance in said phase of said outputted clock pulses;
- wherein, when said determining means determining that said degree of dimensional variation of said workpiece surface is positive, said controlling means controls said switcher to output said at least two series of clock pulses in said first clock-pulse-outputting order, and
- wherein, when said determining means determines that said degree of dimensional variation of said workpiece surface is negative, said controlling means controls said switcher to output said at least two series of clock pulses in said second clock-pulse-outputting order.

40. A laser drawing apparatus for drawing a pattern on a surface of a workpiece by scanning said workpiece surface with at least one laser beam and by modulating said at least one beam on a basis of raster-graphic data, in accordance with a series of clock pulses, said workpiece surface being scanned with said at least one laser beam by moving said workpiece surface with respect to said at least one laser beam, said apparatus comprising:

- means for detecting a dimensional variation of said workpiece surface in a scanning direction of said at least one laser beam with respect to a standard dimension;
- means for calculating a degree of variation between said dimension of said workpiece surface and said standard dimension;
- means for determining whether a degree of dimensional variation of said workpiece is positive or negative with respect to said standard dimension; and
- means for cyclically shifting a phase of said series of clock pulses by a unit of less than 2 π in such a manner that a pattern to be drawn on said workpiece surface is dimensionally varied, in accordance with one of said positive degree of dimensional variation or said negative degree of dimensional variation of said workpiece surface determined by said determining means,
- wherein aid cyclically shifting means regulates a cyclic shift of said phase of said series of clock pulses to cause one of an advance in said phase of said series of clock pulses in such a manner that said pattern to be drawn on the workpiece surface is dimensionally scaled-up when said determining means determining that said degree of dimensional variation of said workpiece surface is positive, and to cause a delay in said phase of clock pulses in such a manner that said pattern to be drawn on said workpiece surface is dimensionally scaled-down when said determining means determines that said degree of dimensional variation of said workpiece is negative.

41. A laser drawing apparatus as set forth in claim 40, wherein said detecting means comprises:

- means for optically and electronically sensing a mark of said workpiece surface with respect to a coordinate system, defined in a plane in which said workpiece surface is included, to produce video signals carrying said mark, said coordinate system defining said standard dimension; and
- means for processing said video signals to obtain said dimensional variation of said workpiece surface in said scanning direction with respect to said standard dimension defined by said coordinate system.

42. A laser drawing apparatus as set forth in claim 40, wherein said calculating means calculates said degree of variation between said dimension of workpiece surface said standard dimension as a degree of expansion/contraction of said workpiece surface in said scanning direction with respect to said standard dimension.

43. A laser drawing apparatus as set forth in claim 40, wherein said cyclically shifting means comprises:

- means for producing at least two series of clock pulses on a basis of a series of basic clock pulses, respective series of clock pulses having phases shifted from each other;
- a switcher that selectively outputs one of said at least two series of clock pulses from said producing means; and
- means for controlling said switcher to output said at least two series of clock pulses in one of a first clock-pulse-outputting order, to cause a cyclic advance in a phase of said outputted clock pulses, or a second clock-pulse-outputting order to cause a cyclic delay in said phase of said outputted clock pulses,
- wherein, when determining means determines that said degree of dimensional variation of said workpiece surface is positive, said controller means controls said switcher to output said at least two series of clock pulses in said first clock-pulse-outputting order, and
- wherein, when said determining means determines that said degree of dimensional variation of said workpiece surface is negative, said controlling means controls said switcher to output said at least two series of clock pulses in said second clock-pulse-outputting order.

44. A laser drawing apparatus for drawing a pattern on a surface of a workpiece be scanning said workpiece surface with at least one laser beam in both a main-scanning direction and in a sub-scanning direction, said at least one laser beam being modulated on a basis of raster-graphic data, said scanning of said workpiece surface with said at least one laser beam in said main-scanning direction being carried out by deflecting said at least one laser beam with respect to said workpiece surface, in accordance with a first series of clock pulses, said scanning of said workpiece surface with said at least one laser beam in said sub-scanning direction being carried out by moving said workpiece surface with respect to said at least one laser beam, in accordance with a second series of clock pulses, said apparatus comprising:

- means for detecting dimensional variations of said workpiece surface in both said main-scanning direction and said sub-scanning direction of said at least one laser beam with respect to standard dimensions;
- means for calculating respective degrees of variation between dimensions of said workpiece surface in both said main-scanning direction and said sub-scanning direction, and said dimensions;

first means for determining whether said degree of dimensional variation of said workpiece surface, in said main-scanning direction, is positive or negative with respect to a corresponding standard dimension;

first means for cyclically shifting a phase of said first series of clock pulses by a unit of less than 2 π in such a manner that a pattern drawn on said workpiece surface is dimensionally varied, in accordance with either said positive or negative degree of dimensional variation of said workpiece surface, determined by said first determining means, in said main-scanning direction;

second means for determining whether said degree of dimensional variation of the workpiece surface, in said sub-scanning direction, is positive or negative with respect to another corresponding standard dimension; and second means for cyclically shifting a phase of said second series of clock pulses by a unit of less than 2 π in such a manner that said pattern drawn on said workpiece surface is dimensionally varied, in accordance with either said positive or negative degree of dimensional variation of said workpiece surface, determined by said second determining means, in said sub-scanning direction.

45. A laser drawing apparatus as set forth in claim 44, wherein said detecting means comprises:

means for optically and electronically sensing a mark of said workpiece surface with respect to a coordinate system, defined in a plane in which said workpiece surface is included, to thereby produce video signals carrying said mark thereof, said coordinate system defining said standard dimension; and means for processing said video signals to obtain said dimensional variation of said workpiece surface in said scanning direction with respect to said standard dimension defined by said coordinate system.

46. A laser drawing apparatus as set forth in claim 44, wherein said calculating means calculates said degree of variation between said dimension of said workpiece surface and said standard dimension as a degree of expansion/contraction of said workpiece surface in said scanning direction with respect to said standard dimension.

47. A laser drawing apparatus as set forth in claim 44, wherein said first cyclically shifting means comprises:

means for producing at least two series of clock pulses on a basis of a series of basic clock pulses, respective series of clock pulses having phases shifted from each other;

a switcher that selectively outputs any of said at least two series of clock pulses as said first series of clock pulses from said producing means; and means for controlling said switcher to output said at least two series of clock pulses in one of a first clock-pulse-outputting order, to cause a cyclic delay in said phase of said outputted clock pulses, or a second clock-pulse-outputting order, to cause a cyclic advance in said phase of said outputted clock pulses, wherein, when said first determining means determines that said degree of dimensional variation of said workpiece surface in said main-scanning direction is positive, said controlling means controls said switcher to output said at least two series of clock pulses therefrom in said first clock-pulse-outputting order, and wherein, when said first determining means determines that said degree of dimensional variation of said workpiece surface in said main-scanning direction is negative, said controlling means controls said switcher to output said at least two series of clock pulses in said second clock-pulse-outputting order.

48. A laser drawing apparatus as set forth in claim 44, wherein said second cyclically shifting means comprises:

means for producing at least two series of clock pulses on the basis of a series of basic clock pulses, respective series of clock pulses having phases shifted from each other;

a switcher that selectively outputs any one of said at least two series of clock pulses as said second series of clock pulses from said producing means; and means for controlling said switcher to output said at least two series of clock pulses in one of a first clock-pulse-outputting order, to cause a cyclic advance in a phase of said outputted clock pulses, or a second clock-pulse-outputting order, to cause a cyclic delay in said phase of said outputted clock pulses, wherein, when said second determining means determines that said degree of dimensional variation of said workpiece surface in said sub-scanning direction is positive, said controlling means controls said switcher to output said at least two series of clock pulses in said first clock-pulse-outputting order, and wherein, when said second determining means determines that said degree of dimensional variation of said workpiece surface in said sub-scanning direction is negative, said controlling means controls said switcher to output said at least two series of clock pulses in said second clock-pulse-outputting order.

* * * * *